(12) United States Patent
Oh et al.

(10) Patent No.: US 8,501,623 B2
(45) Date of Patent: Aug. 6, 2013

(54) METHOD OF FORMING A SEMICONDUCTOR DEVICE HAVING A METAL SILICIDE AND ALLOY LAYERS AS ELECTRODE

(75) Inventors: Gyuhwan Oh, Hwaseong-si (KR); Young-Lim Park, Hwaseong-si (KR); Soonoh Park, Suwon-si (KR); Dongho Ahn, Hwaseong-si (KR); Jinil Lee, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 232 days.

(21) Appl. No.: 12/841,430

(22) Filed: Jul. 22, 2010

(65) Prior Publication Data

US 2011/0020998 A1   Jan. 27, 2011

(30) Foreign Application Priority Data

Jul. 22, 2009   (KR) .................. 10-2009-0066990

(51) Int. Cl.
   *H01L 21/44* (2006.01)
(52) U.S. Cl.
   USPC .......... 438/675; 438/597; 438/665; 438/666; 438/682; 257/768; 257/E21.006
(58) Field of Classification Search
   USPC ............... 438/381, 597, 665, 666, 675, 682, 438/FOR. 189, FOR. 212, FOR. 356; 257/768, 257/E21.006
   See application file for complete search history.

(56) References Cited

U.S. PATENT DOCUMENTS

| | | | |
|---|---|---|---|
| 5,420,074 A * | 5/1995 | Ohshima | 438/620 |
| 5,846,881 A * | 12/1998 | Sandhu et al. | 438/683 |
| 2006/0237756 A1* | 10/2006 | Park et al. | 257/296 |
| 2007/0238226 A1* | 10/2007 | Lowrey | 438/131 |
| 2008/0308784 A1 | 12/2008 | Oh et al. | |
| 2008/0315174 A1 | 12/2008 | Kang et al. | |
| 2009/0026439 A1* | 1/2009 | Park et al. | 257/4 |
| 2009/0315182 A1* | 12/2009 | Besser et al. | 257/754 |

FOREIGN PATENT DOCUMENTS

| | | |
|---|---|---|
| JP | 2008-311666 | 12/2008 |
| JP | 2009-004785 | 1/2009 |
| KR | 10-0881055 | 12/2008 |
| KR | 2008-111206 | 12/2008 |
| KR | 2009-21762 | 3/2009 |

* cited by examiner

*Primary Examiner* — Thanh V Pham
(74) *Attorney, Agent, or Firm* — Stanzione & Kim, LLP

(57) ABSTRACT

A semiconductor device includes an electrode having a metal silicide layer and a metal alloy layer, and a data storage element formed on the electrode. The metal silicide layer has a concave surface to correspond to a convex surface of the metal alloy layer such that the concave surface of the metal silicide layer and the convex surface of the metal alloy layer form a curved boundary.

29 Claims, 27 Drawing Sheets

METHOD OF FORMING A SEMICONDUCTOR DEVICE HAVING A METAL SILICIDE AND ALLOY LAYERS AS ELECTRODE

CROSS-REFERENCE TO RELATED APPLICATIONS

This application claims the benefit of priority under 35 U.S.C. §119 from Korean Patent Application No. 10-2009-66990, filed on Jul. 22, 2009, in the Korean Intellectual Property Office, the disclosure of which is hereby incorporated herein by reference in its entirety.

BACKGROUND

1. Field of the Invention

The present general inventive concept relates to a method of forming a semiconductor device, and more particularly, to a method of forming a non-volatile memory device having a metal alloy electrode.

2. Description of the Related Art

Semiconductor memory devices may be classified into volatile and non-volatile memory devices. A phase change memory device, which is a type of non-volatile memory device, includes a lower electrode and a phase change material layer in contact with the lower electrode. Here, the lower electrode serves as a heating device. Various methods have been researched to control the resistance of the lower electrode and increase production efficiency.

SUMMARY OF THE INVENTION

The present general inventive concept provides a method of forming a semiconductor device, which is capable of controlling a resistance of a lower electrode and increasing production efficiency.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by a method of forming a memory device, the method including forming a metal silicide layer and a metal alloy layer as an electrode and forming a data storage element on the electrode, wherein the metal silicide layer has a concave surface to correspond to a convex surface of the metal alloy layer such that the concave surface of the metal silicide layer and the convex surface of the metal alloy layer form a curved boundary The forming of the metal silicide layer and metal allow layer may include forming a recessed portion of the metal silicide layer, and forming the metal alloy in the recessed portion of the metal silicide layer such that the recessed portion corresponds to the curved boundary.

The forming of the electrode may include forming a semiconductor layer, forming a metal layer on the semiconductor layer, forming an alloying element layer on the metal layer, treating the semiconductor layer and the metal layer to form the metal silicide layer with a recessed portion, and treating the metal layer and the alloying element layer to form the metal alloy layer having a protruding portion disposed in the recessed portion.

The forming of the electrode may include forming a semiconductor layer containing a first material, forming a metal layer having a second material on the semiconductor layer, and forming an alloying element layer having a third material on the metal layer.

The forming of the metal silicide layer includes treating the first material of the semiconductor layer and the second material of the metal layer to form the metal silicide layer.

The forming of the metal alloy layer may include treating the second material of the metal layer and the third material of the alloying element layer to form the metal alloy layer.

The forming of the metal silicide layer and metal alloy layer may include simultaneously treating the first material, second material, and the third material such that the treated first and second materials have the curved boundary line with the treated second and third materials.

The forming of the metal silicide layer and metal alloy layer may include simultaneously treating the first material and the second material to form the metal silicide layer with a recessed portion with respect to the semiconductor layer, and treating the second material and the third material to form the metal alloy layer having a shape corresponding to the recessed portion as the boundary line.

The first material may include a semiconductor material, and the second material may include a transition metal, and the third material may include one of a carbon material and a nitride material.

The semiconductor layer may include a word line formed on a plane in a substrate, the semiconductor layer may include a diode layer on another plane, and a boundary formed between the metal silicide layer and the metal alloy layer may be the curved line with respect to the plane and the another plane.

The metal layer may include a first metal layer disposed on a first area to form the metal silicide layer with the semiconductor layer, and a second metal layer disposed on a second area different from the first area to form the metal alloy layer with the alloying element layer.

The forming of the electrode may include simultaneously forming the metal silicide layer and the metal alloy layer.

The metal silicide layer may include an ohmic layer, and the metal alloy layer comprises a heating device to heat the data storage element to store data.

The method of forming a memory device may further include forming an insulating layer on a portion of the metal alloy layer, wherein the data storage element is disposed on the insulating layer and the metal alloy layer.

The metal alloy layer may include a nitride alloy layer.

The method of forming a memory device may further include forming a nitride alloy layer between the data storage element and a portion of the metal alloy layer.

The method of forming a memory device may further include forming an insulating layer to define a contact hole in which the electrode is formed, and forming a word line and a bit line to electrically contact the electrode and the data storage element, wherein at least a portion of one of the word line and the bit line is formed to be disposed within the contact hole defined by the insulation layer.

The method of forming a memory device may further include forming an insulation layer to define a contact hole in which the electrode is formed, forming a spacer in the contact hole defined by the insulation layer, and forming a word line and a bit line to electrically contact the electrode and the data storage element, wherein the spacer may include inside walls to define a width, and the metal silicide layer and the metal alloy layer metal are formed within the width of the inside walls.

The method of forming a memory device may further include forming a spacer on a portion of the semiconductor layer to form a contact hole, wherein the spacer may include inside walls to define a width narrower than a width of the semiconductor layer, and the metal silicide layer and a metal alloy layer metal are formed within the inside walls.

The forming of the data storage element may include forming the data storage element to be disposed within the width defined by the inside walls of the spacer.

The method of forming a memory device may further include forming a word line and a bit line to electrically contact the electrode and the data storage element, wherein at least a portion of one of the word line and the bit line is formed to be disposed within the width defined by the inside walls of the spacer.

The metal silicide layer is disposed on the semiconductor layer in a curved direction, and the metal alloy layer may include a first portion disposed on the metal silicide layer in the curved direction and a second portion extended from an end of the metal silicide layer in another direction toward the data storage element.

At least a portion of the metal silicide layer may be disposed inside the semiconductor layer.

The metal silicide layer may include a first portion formed in the semiconductor layer and a second portion protruding from the first portion outside the semiconductor layer.

The forming of the metal silicide layer and the metal alloy layer may include forming a substrate, and repeatedly forming a combination of a transition metal and a carbon-including material on the substrate to form the metal silicide layer and the metal alloy layer as the electrode.

The concave surface of the metal silicide layer may include a center area and a circumference area having a thickness to be increased according to a distance from the center area.

The convex surface of the metal alloy layer may include a center area and a circumference area having a distance with respect to the data storage element to be decreased according to a distance from the center area.

The foregoing and/or other aspects and utilities of the general inventive concept may be achieved by a method of forming a memory device, the method including simultaneously forming a metal silicide layer and a metal alloy layer as an electrode, and forming a data storage element connectable to the electrode.

The foregoing and/or other aspects and utilities of the general inventive concept may be achieved by a method of forming a memory device, the method including forming a metal silicide layer as an ohmic layer of an electrode, forming a metal carbide alloy layer or a metal silicon nitride alloy layer on the metal silicide layer as another layer of the electrode, and forming a data storage element connectable to the another layer of the electrode.

The foregoing and/or other aspects and utilities of the general inventive concept may be achieved by a method of forming a memory device, the method including forming a semiconductor layer, forming and treating a first layer on the semiconductor layer to form a first electrode using a component of the semiconductor and a component of the first layer, forming and treating a second layer on the first layer to form a second electrode using a component of the first layer and a component of the second layer, and forming a data storage element on the second electrode.

The first layer and the second layer may be formed at the same time.

The first electrode may be an ohmic layer to control a current flowing through the second electrode, and the second electrode is a driver to control a characteristic of the data storage element.

The foregoing and/or other aspects and utilities of the general inventive concept may be achieved by a method of forming a memory device, the method including forming a substrate, forming a metal silicide layer in a recess of the substrate and forming a metal alloy layer on the metal silicide layer, as an electrode, and forming a data storage element on the electrode.

The metal silicide layer may include a portion disposed in the first recess of the substrate and another portion extended from the portion to protrude from the substrate.

The metal alloy layer may be formed on a portion of the metal silicide layer such that another portion of the metal silicide layer is not covered by the metal alloy layer.

The substrate may be disposed on a plane in a direction, and the metal alloy layer has a first portion disposed on a portion of the metal silicide layer and a second portion extended in a second direction from the first portion such that a remaining portion of the metal silicide layer is not covered by the first portion of the metal alloy layer.

The foregoing and/or other aspects and utilities of the general inventive concept may be achieved by a memory device including an electrode having a metal silicide layer and a metal alloy layer, and a data storage element formed on the electrode, wherein the metal silicide layer has a concave surface to correspond to a convex surface of the metal silicide layer and the convex surface of the metal alloy layer form a curved boundary.

The metal silicide layer may include a recessed portion, and the metal alloy layer may be disposed in the recessed portion of the metal silicide layer such that the recessed portion corresponds to the curved boundary.

The memory device further includes a semiconductor layer, a metal layer formed on the semiconductor layer, an alloying element formed on the metal layer, wherein the semiconductor layer and the metal layer are treated to form the metal silicide layer, and the metal layer and the allowing element layer are treated to form the metal alloy layer.

The memory device further includes a semiconductor layer, a metal layer formed on the semiconductor layer containing a first material, a metal layer having a second material formed on the semiconductor layer, and an alloying element layer having a third material formed on the metal layer, wherein the first material of the semiconductor layer and the second material of the metal layer are treated to form the metal silicide layer.

The second material of the metal layer and the third material of the alloying element layer may be treated to form the metal alloy layer.

The metal silicide layer may include a portion disposed in the first recess of the substrate and another portion extended from the portion to protrude from the substrate.

The metal alloy layer may be formed on a portion of the metal silicide layer such that another portion of the metal silicide layer is not covered by the metal alloy layer.

The substrate may be disposed on a plane in a direction, and the metal alloy layer has a first portion disposed on a portion of the metal silicide layer and a second portion extended in a second direction from the first portion such that a remaining portion of the metal silicide layer is not covered by the first portion of the metal alloy layer.

The concave surface of the metal silicide layer may include a center area and a circumference area having a thickness to be increased according to a distance from the center area.

The convex surface of the metal alloy layer may include a center area and a circumference area having a distance with respect to the data storage element to be decreased according to a distance from the center area.

The foregoing and/or other aspects and utilities of the general inventive concept may be achieved by a memory device including a metal silicide layer and a metal alloy layer simultaneously formed as an electrode, and a data storage element formed to be connectable to the electrode.

The foregoing and/or other aspects and utilities of the general inventive concept may be achieved by a memory device including a metal silicide layer formed as an ohmic layer of an electrode, a metal carbide alloy layer or a metal silicon nitride alloy formed on the lower layer as another layer of the electrode, and a data storage element formed to be connectable to the another layer of the electrode.

The foregoing and/or other aspects and utilities of the general inventive concept may be achieved by a memory device including a semiconductor layer, a first layer formed on the semiconductor as a first electrode containing a component of the semiconductor layer, a second layer formed on the first layer as a second electrode containing a component of the first layer, and a data storage element formed to be connectable to the second electrode.

The first electrode and the second electrode are treated at the same time.

The first electrode may be an ohmic layer to control a current flowing through the second electrode, and the second electrode may be a driver to control a characteristic of the data storage element.

The foregoing and/or other aspects and utilities of the general inventive concept may be achieved by a memory device including a substrate, a metal silicide layer formed in a recess of the substrate as a first electrode of an electrode, a metal alloy layer formed on the metal silicide layer, as a second electrode of the electrode, and a data storage element formed to be connectable to the electrode.

The metal silicide layer may include a portion disposed in the first recess of the substrate and another portion extended form the portion to protrude from the substrate.

The metal alloy layer may be formed on a portion of the metal silicide layer such that another portion of the metal silicide layer is not covered by the metal alloy layer.

The substrate may be disposed on a plane in a direction, and the metal alloy layer has a first portion disposed on a portion of the metal silicide layer and a second portion extended in a second direction from the first portion such that a remaining portion of the metal silicide layer is not covered by the first portion of the metal alloy layer.

The foregoing and/or other aspects and utilities of the general inventive concept may be achieved by a method of forming a memory device, the method including forming a substrate including a word line, forming an electrode on the substrate, including forming a metal silicide layer and metal alloy layer as the electrode, and forming a data storage element on the electrode, wherein the metal silicide layer has a concave surface to correspond to a convex surface of the metal alloy layer such that the concave surface of the metal silicide layer and the convex surface of the metal alloy layer form a curved boundary, and forming a data storage element on the electrode, and forming a bit line to be connectable to the data storage element.

The foregoing and/or other aspects and utilities of the general inventive concept may be achieved by a method of forming a memory device, the method including forming a substrate including a word line, forming an electrode formed on the substrate, including simultaneously forming a metal silicide layer and a metal alloy layer as an electrode, and forming a data storage element connectable to the electrode, forming a data storage element on the electrode, and forming a bit line to be connectable to the data storage element.

The foregoing and/or other aspects and utilities of the general inventive concept may be achieved by a method of forming a memory device, the method including forming a substrate including a word line, forming an electrode formed on the substrate, including forming a metal silicide layer as an ohmic layer of an electrode, and forming a metal carbide alloy layer or a metal silicon nitride alloy layer on the metal silicide layer as another layer of the electrode, forming a data storage element on the electrode, and forming a bit line to be connectable to the data storage element.

The foregoing and/or other aspects and utilities of the general inventive concept may be achieved by a method of forming a memory device, the method including forming a substrate including a word line, forming an electrode formed on the substrate, including forming and treating a first layer on the semiconductor layer to form a first electrode using a component of the semiconductor and a component of the first layer, and forming and treating a second layer on the first layer to form a second electrode using a component of the first layer and component of the second layer, forming a data storage element on the second electrode, and forming a bit line to be connectable to the electrode.

The foregoing and/or other aspects and utilities of the general inventive concept may be achieved by a method of forming a memory device, the method including forming a substrate including a word line, forming an electrode on the substrate, including forming a metal silicide layer in a recess of the substrate and forming a metal alloy layer on the metal silicide layer, as an electrode, forming a data storage element on the electrode, and forming a bit line to be connectable to the data storage element.

The foregoing and/or other aspects and utilities of the general inventive concept may be achieved by a memory device including a substrate including a word line, an electrode having a metal silicide layer and metal alloy layer, wherein the metal silicide layer has a concave surface to correspond to a convex surface of the metal alloy layer such that the concave surface of the metal silicide layer and the convex surface of the metal alloy layer formed a curved boundary, a data storage element formed on the electrode, and a bit line formed to be connectable to the data storage element.

The foregoing and/or other aspects and utilities of the general inventive concept may be achieved by a memory device including a substrate including a word line, a metal silicide layer and metal alloy layer simultaneously formed as an electrode, a data storage element formed to be connectable to the electrode, and a bit line formed to be connectable to the data storage element.

The foregoing and/or other aspects and utilities of the general inventive concept may be achieved by a memory device including a substrate including a word line, a metal silicide layer formed as an ohmic layer of an electrode, a metal carbide alloy layer or a metal silicon nitride alloy formed on the ohmic layer as another layer of the electrode, a data storage element formed to be connectable to the another layer of the electrode, and a bit line formed to be connectable to the data storage element.

The foregoing and/or other aspects and utilities of the general inventive concept may be achieved by a memory device including a semiconductor layer including a word line, a first layer formed on the semiconductor layer as a first electrode containing a component of the semiconductor layer, a second layer formed on the first layer as a second electrode containing a component of the first layer, a data storage element formed to be connectable to the second electrode, and a bit line formed to be connectable to the data storage element.

The foregoing and/or other aspects and utilities of the general inventive concept may be achieved by a memory device including a substrate including a word line, a metal silicide layer formed in a recess of the substrate as a first electrode of an electrode, a metal alloy layer formed on the metal silicide layer, as a second electrode of the electrode, a data storage element formed to be connectable to the electrode, and a bit line formed to be connectable to the data storage element.

The foregoing and/or other aspects and utilities of the general inventive concept may be achieved by an electronic apparatus including a memory device having a memory unit having a substrate including a word line, an electrode having a metal silicide layer and metal alloy layer, wherein the metal silicide layer has a concave surface to correspond to a convex surface of the metal alloy layer such that the concave surface of the metal silicide layer and the convex surface of the metal alloy layer form a curved boundary, a data storage element formed on the electrode, and a bit line formed to be connectable to the data storage element, and a memory controller to control the memory unit to store data, a function unit to perform an operation according to the data, and a controller connected to the memory device to transmit the data and connected to the function unit to control the function unit to perform the operation according to the data.

The foregoing and/or other aspects and utilities of the general inventive concept may be achieved by a method of forming a memory device, the method including providing a substrate having a conductive word line on an upper surface, forming a semiconductor on the upper surface of the substrate at a location corresponding to the word line, forming an electrode on the semiconductor, the electrode having a concave shape including a center portion corresponding to an upper surface of the semiconductor, and forming a data storage element on the electrode.

The method further may include forming an insulation layer on the upper surface of the substrate and forming a hole in the insulation layer to expose the word line of the substrate. The semiconductor may be formed in the hole of the insulation layer.

Forming the semiconductor may include forming a first semiconductor pattern on the word line and forming a second semiconductor pattern on the first semiconductor pattern. Forming the electrode may include forming a metal layer on the upper surface of the semiconductor, the side surfaces of the hole, and the upper surface of the insulation layer, forming an alloying layer on the metal layer, and treating the metal layer and the alloying layer to form the electrode.

Treating the metal layer and the alloying layer may include annealing the metal layer and the alloy layer.

Treating the metal layer and the alloying layer may include forming a metal silicide layer of an upper portion of the semiconductor and an adjacent, lower portion of the metal layer and forming a metal alloy layer of an upper portion of the metal layer and an adjacent portion of the alloying layer.

Forming the data storage element may include forming a phase change material pattern on the electrode.

The electrode may include a horizontal portion on an upper surface of the insulation layer and a vertical portion on the sides of the hole, and the method further may include cutting an upper portion of the insulation layer to expose the vertical portion of the electrode and filling a cavity defined by a portion of the electrode facing a center of the hole with a core layer.

The method further may include forming the data storage element on an upper surface of the insulation layer, electrode, and core layer.

The word line may extend in a first direction and the method further may include forming a conductive bit line on the data storage element, the bit line extending in a second direction perpendicular to the first direction.

The foregoing and/or other aspects and utilities of the general inventive concept may also be achieved by a memory device including a substrate having a conductive word line on an upper surface, a semiconductor located on the upper surface of the substrate at a location corresponding to the word line, an electrode located on the semiconductor, the electrode having a concave shape including a center portion corresponding to an upper surface of the semiconductor, and a data storage element located on the electrode.

The memory device may include an insulation layer on the upper surface of the substrate, the insulation layer having a hole therein to expose the word line of the substrate, and the semiconductor may be located in the hole of the insulation layer.

The semiconductor may include a first semiconductor pattern located on the word line and a second semiconductor pattern located on the first semiconductor pattern.

The electrode may include a metal silicide layer and a metal alloy layer.

The data storage element may include a phase change material pattern.

The electrode may include a horizontal portion adjacent to the semiconductor and a vertical portion on the sides of the hole, the horizontal and vertical portions of the electrode defining a cavity, and the memory device further may include a core layer filling the cavity defined by the horizontal and vertical portions of the electrode. An upper surface of the insulation layer, an upper surface of a vertical portion of the electrode, and an upper surface of the core layer may define a substantially planar first upper surface.

The data storage element may be located on the first upper surface.

The word line may extend in a first direction and the memory device may include a conductive bit line located on the data storage element, the bit line extending in a second direction perpendicular to the first direction.

The foregoing and/or other aspects and utilities of the general inventive concept may also be achieved by a method of forming a memory device, the method including providing a substrate including at least first and second conductive word lines in an upper surface thereof, forming a first insulation layer on the substrate, the insulation layer formed to expose a portion of the first and second word lines, forming first and second semiconductors on the exposed portions of the first and second word lines, respectively, forming a second insulation layer on the first insulation layer to cover a portion of the first and second semiconductors and to expose a portion of the first and second semiconductors, forming first and second lower electrodes on the exposed portions of the first and second semiconductors, respectively, and forming a data storage component on an upper surface of the second insulation layer and the first and second electrodes.

Forming the first insulation layer may include forming the first insulation layer to cover the substrate and the first and second word lines and forming first and second holes in the first insulation layer corresponding to portions of the first and second word lines to expose the portions of the first and second word lines.

The first and second semiconductors may be formed in the first and second holes, respectively.

Forming the second insulation layer may include forming the second insulation layer to cover the first insulation layer and the first and second semiconductors and forming a hole in the second insulation layer to expose portions of the first and second semiconductors and to leave portions of the first and second semiconductors covered by the second insulation layer.

Forming the first and second lower electrodes may include forming a metal layer to cover a bottom of the hole may include the exposed portions of the first and second semiconductors and side portions of the hole, forming an alloying layer on the metal layer, and treating the metal layer and the alloying layer to form the first and second lower electrodes.

Treating the metal layer and the alloying layer may include annealing the metal layer and the alloying layer to form a metal silicide layer from an upper portion of the first and second semiconductors and a lower portion of the metal layer adjacent to the first and second semiconductors and to form a metal alloy layer from an upper portion of the metal layer and an adjacent portion of the alloying layer.

Forming the metal layer and the alloying layer may include forming the metal layer and the alloying layer to cover a portion of the bottom of the hole between the first and second semiconductors, and the method further may include treating the metal layer and the alloying layer to form a single electrode layer and removing a portion of the single electrode layer between the first and second semiconductors to form the first and second lower electrodes.

The method may include forming a core layer to fill the hole, and the data storage component may be formed on an upper surface of the core layer, the first and second electrodes, and the second insulation layer.

The method may include forming a bit line on the data storage component, and the first and second word lines may extend parallel to each other in a first direction, and the bit line may extend in a second direction perpendicular to the first direction.

The foregoing and/or other aspects and utilities of the general inventive concept may also be achieved by a memory device including a substrate including at least first and second conductive word lines in an upper surface thereof, a first insulation layer on the substrate, the insulation layer formed to leave exposed a portion of the first and second word lines, first and second semiconductors located on the exposed portions of the first and second word lines, respectively, a second insulation layer on the first insulation layer to cover a portion of the first and second semiconductors and to leave exposed a portion of the first and second semiconductors, first and second lower electrodes located on the exposed portions of the first and second semiconductors, respectively, and a data storage component on an upper surface of the second insulation layer and the first and second electrodes.

The first insulation layer may include first and second holes corresponding to portions of the first and second word lines to expose the portions of the first and second word lines.

The first and second semiconductors may be located in the first and second holes, respectively.

The second insulation layer may include a hole to expose portions of the first and second semiconductors and to leave portions of the first and second semiconductors covered by the second insulation layer.

The first and second lower electrodes may include a metal silicide layer adjacent to the first and second semiconductors and a metal alloy layer adjacent to the metal silicide layer.

The memory device may include a core layer to fill the hole, and the data storage component is formed on an upper surface of the core layer, the first and second electrodes, and the second insulation layer.

BRIEF DESCRIPTION OF THE DRAWINGS

The above and/or other aspects and utilities of the present general inventive concept will become apparent and more readily appreciated from the following description of the exemplary embodiments, taken in conjunction with the accompanying drawings, in which.

DETAILED DESCRIPTION OF EXAMPLE EMBODIMENTS

Figure 1:
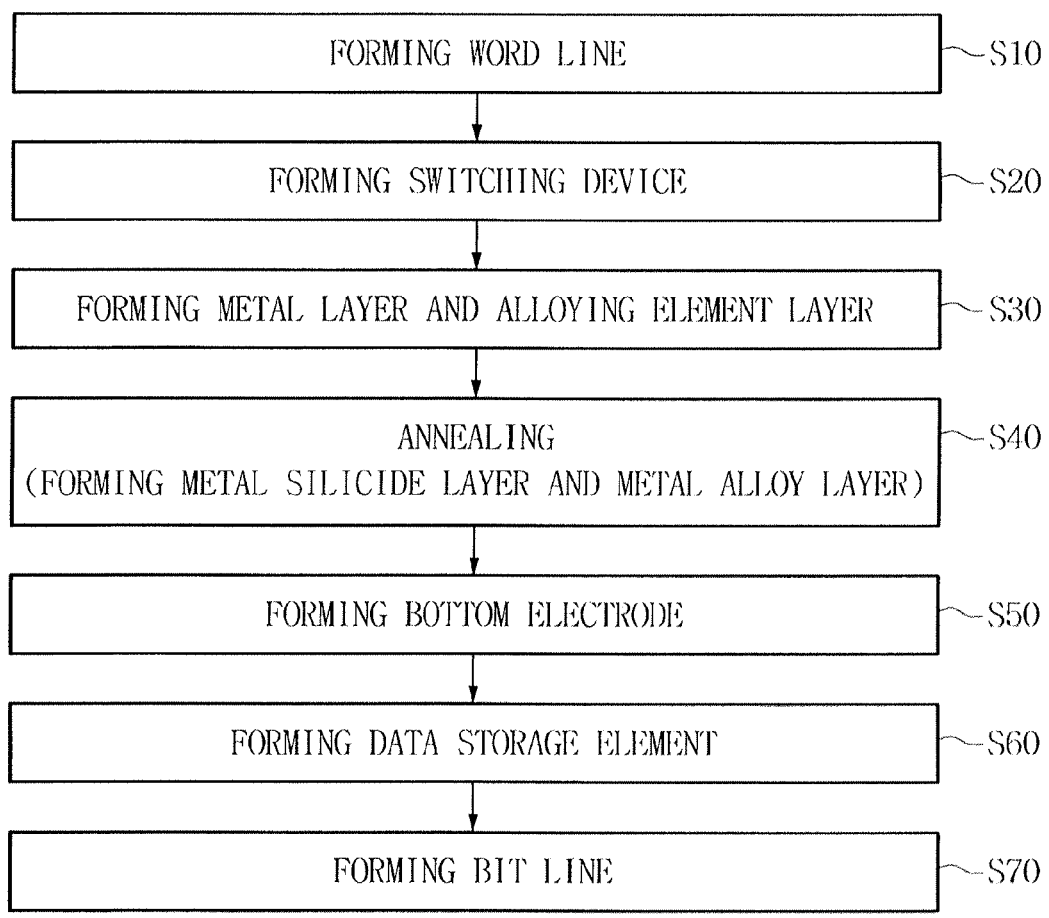
FIG. 1 is a flowchart illustrating a method of forming a phase change memory device according to an example embodiment of the present general inventive concept.

Reference will now be made in detail to several embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
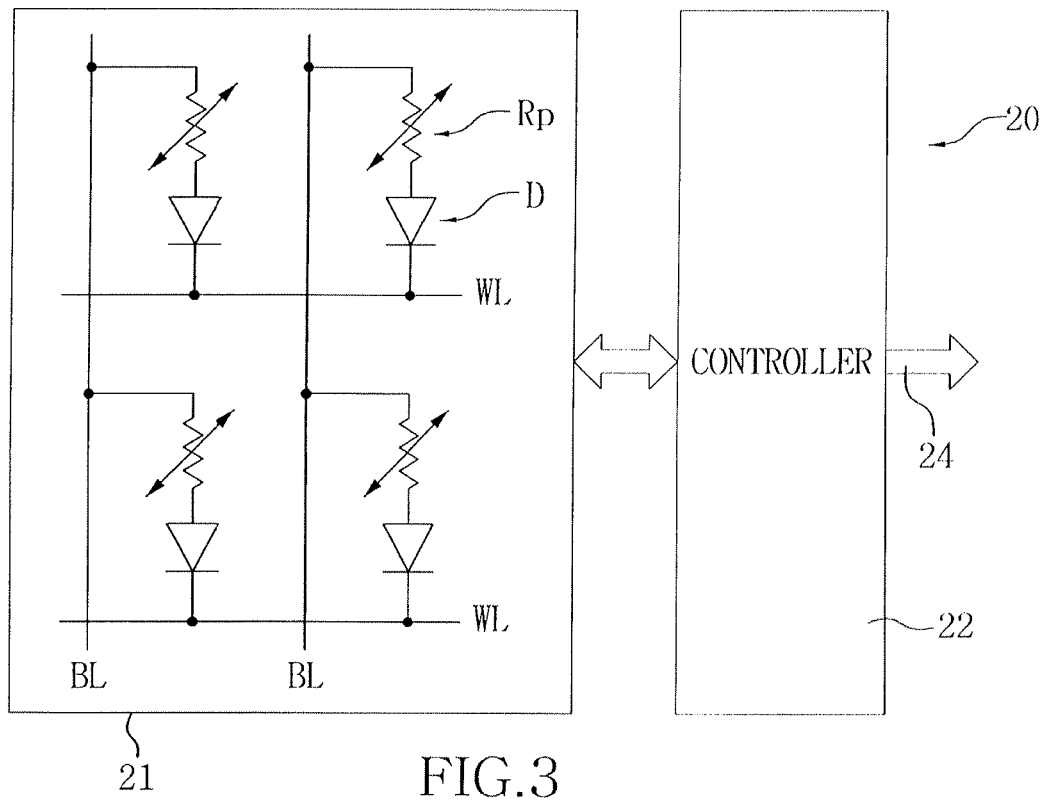
FIG. 2 is an equivalent circuit diagram of a part of a cell array region of the phase change memory device according to an example embodiment of the present general inventive concept.
Figure 3:
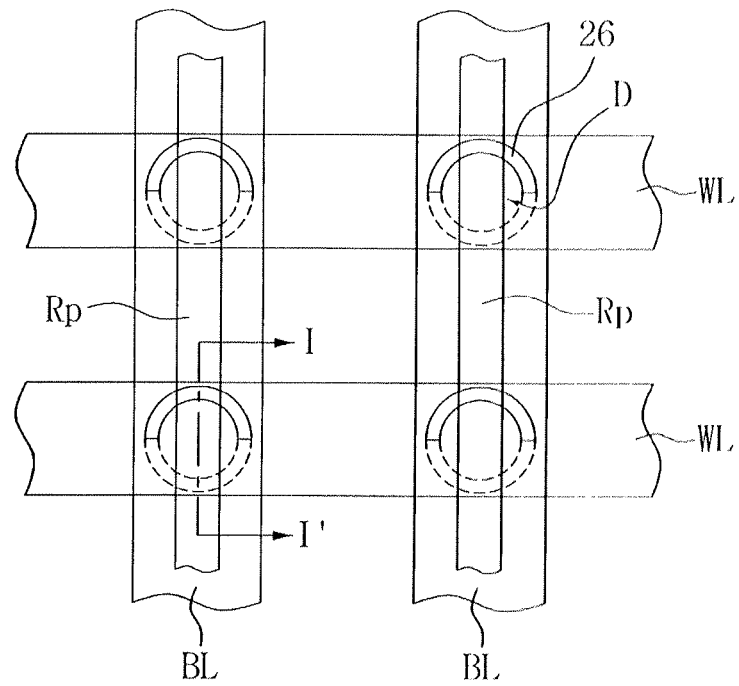
FIG. 3 is a plan view corresponding to the equivalent circuit diagram of FIG. 2.

FIG. 1 is a flowchart illustrating a method of forming a phase change memory device according to a first example embodiment. FIG. 2 is an equivalent circuit diagram of a part of a cell array region of the phase change memory device according to the first example embodiment. FIG. 3 is a plan view corresponding to the equivalent circuit diagram of FIG. 2. FIGS. 4 through 10 are cross-sectional views taken along line I-I' of FIG. 3, which illustrate the method of forming the phase change memory device according to the first example embodiment.

Referring to FIG. 1, the phase change memory device according to the first example embodiment is formed by forming a word line (S10), forming a switching device (S20), forming a metal layer and an alloying element layer (S30), annealing the metal layer and the alloying element layer to form a metal silicide layer and a metal alloy layer (S40), forming a lower electrode (S50), forming a data storage element (S60), and forming a bit line (S70). The metal silicide layer may serve as an ohmic layer. Hereinafter, the process of forming the phase change memory device will be described with reference to the attaching drawings in more detail.

Referring to FIGS. 2 and 3, the phase change memory device 20 according to an example embodiment may include bit lines BL formed parallel to each other in a column direction, word lines WL formed parallel to each other in a row direction, a plurality of phase change material patterns Rp, and a plurality of diodes D.

The bit lines BL may be formed to cross the word lines WL. The diodes D may be formed at intersections of the bit lines BL and the word lines WL. The phase change material patterns Rp may be formed between the bit lines BL and the diodes D. Each diode D may be in electrical contact with a corresponding one of the phase change material patterns Rp via the lower electrode 26. Each phase change material pattern Rp may be in electrical contact with a corresponding one of the bit lines BL. Each diode D may be in electrical contact with a corresponding one of the word lines WL. The diodes D may serve as switching devices. The phase change material patterns Rp may serve as data storage elements. As a result, the bit lines BL may be in electrical contact with the word lines WL via the phase change material patterns Rp, the lower electrode 26 and the diodes D.

In some example embodiments, the diodes D may be omitted. In another example embodiment, the switching device may be a MOS transistor (not shown).

The phase change memory device 20 may be connected to a controller 22 which controls the phase change memory device 20 to write data to or read data from the phase change material patterns Rp. The controller 22 may output data and/or commands 24 to external devices.

Figure 4:
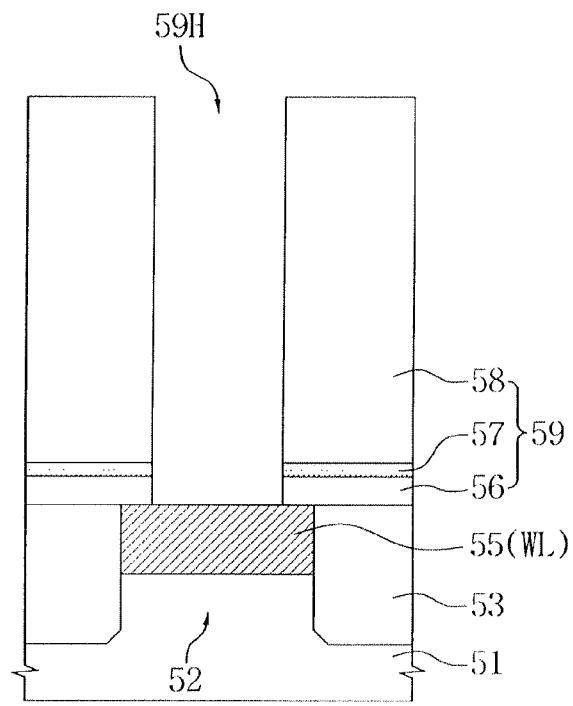
FIGS. 4 through 10 are cross-sectional views taken along line I-I' of FIG. 3, which illustrate the method of forming the phase change memory device according to an example embodiment of the present general inventive concept.

Referring to FIGS. 1, 3 and 4, a word line 55 (WL) may be formed on a substrate 51.

Specifically, as shown in FIG. 4, an isolation layer 53 defining an active region 52 may be formed in a predetermined region of the substrate 51. The substrate 51 may be a semiconductor substrate such as a silicon wafer or a silicon on insulator (SOI) wafer. The substrate 51 may include impurity ions of a first conductivity type. The isolation layer 53 may be formed by a shallow trench isolation (STI) technique. The isolation layer 53 may be formed of silicon oxide, silicon nitride, silicon oxynitride, or a combination thereof. The active region 52 may be formed in a line shape.

The word line 55 (WL) may be formed by injecting impurity ions of a second conductivity type, which is different from the first conductivity type into the active region 52. Here, the word line 55 (WL) may be a conductive pattern containing silicon. Hereinafter, for a brief description, it is assumed that the first and second conductivity types are P- and N-types, respectively. However, in another example embodiment, the first and second conductivity types may be N- and P-types, respectively.

An insulating structure 59 may be formed on the substrate 51 having the word line 55 (WL) and the isolation layer 53. The insulating structure 59 may be formed by chemical vapor deposition (CVD), low-pressure chemical vapor deposition (LPCVD), plasma-enhanced chemical vapor deposition (PECVD), or high-density plasma chemical vapor deposition (HDP-CVD). The insulating structure 59 may be formed to cover the entire surface of the substrate 51. The insulating structure 59 may be formed by sequentially stacking a buffer layer 56, an etch stop layer 57, and an interlayer insulating layer 58. The etch stop layer 57 may be formed of a material layer having an etch selectivity with respect to the buffer layer 56 and the interlayer insulating layer 58. For example, the etch stop layer 57 may be formed of silicon nitride, and the buffer layer 56 and the interlayer insulating layer 58 may be formed of silicon oxide.

In another example embodiment, the insulating structure 59 may be formed in a single layer structure of an oxide layer, a nitride layer, or an oxynitride layer. Here, the oxide layer, the nitride layer and the oxynitride layer may be a silicon oxide layer, a silicon nitride layer, and a silicon oxynitride layer, respectively. In still another example embodiment, the insulating structure 59 may be formed in a multilayer structure in which at least one oxide layer, at least one nitride layer and/or at least one oxynitride layer are sequentially or alternatively stacked.

As shown in FIG. 4, a contact hole 59H exposing a predetermined region of the word line 55 (WL) may be formed by patterning the insulating structure 59. A plurality of contact holes 59H may be formed at regular intervals along the surface of the word line 55 (WL). To pattern the insulating structure 59, photolithography and etching processes may be used. For example, the contact hole 59H may be formed by anisotropically etching the interlayer insulating layer 58 to expose the etch stop layer 57, selectively removing the etch stop layer 57, and selectively removing the buffer layer 56. The etch stop layer 57 and the buffer layer 56 may be selectively removed by anisotropic etching, isotropic etching, or a combination thereof.

In another example embodiment, the word line 55 (WL) may be formed in the insulating structure 59. In this case, the word lines 55 (WL) may be formed of single crystalline silicon, polycrystalline silicon, or metal.

Figure 5:
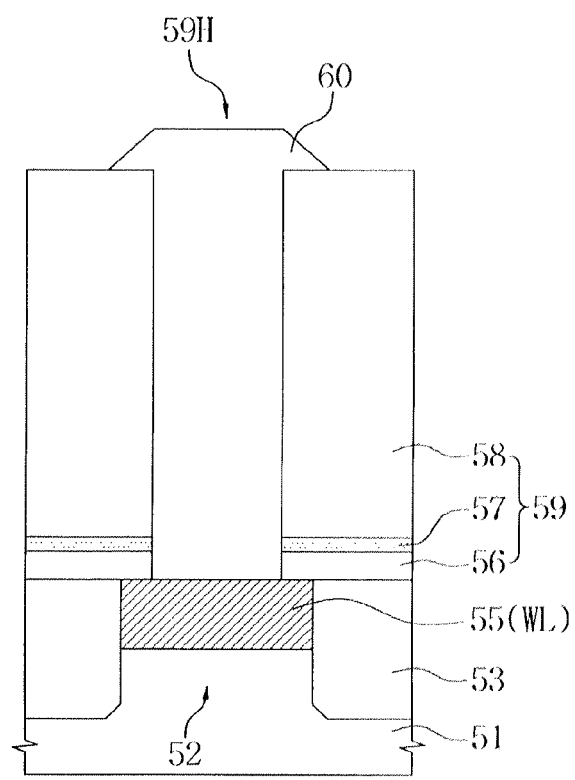

Referring to FIGS. 1, 3 and 5, a semiconductor layer 60 filling the contact hole 59H may be formed. As shown in FIG. 5, the semiconductor layer 60 may be formed using the word line 55 (WL) as a seed by a selective epitaxial growth (SEG) technique. When the word line 55 (WL) includes silicon, the semiconductor layer 60 may also include silicon. The semiconductor layer 60 may completely fill the contact hole 59H, and cover the insulating structure 59.

In another example embodiment, the semiconductor layer 60 may be formed by a solid phase epitaxial growth (SPE) technique. In still another example embodiment, the semiconductor layer 60 may be formed of single crystalline silicon, amorphous silicon, and/or polysilicon.

Figure 6:
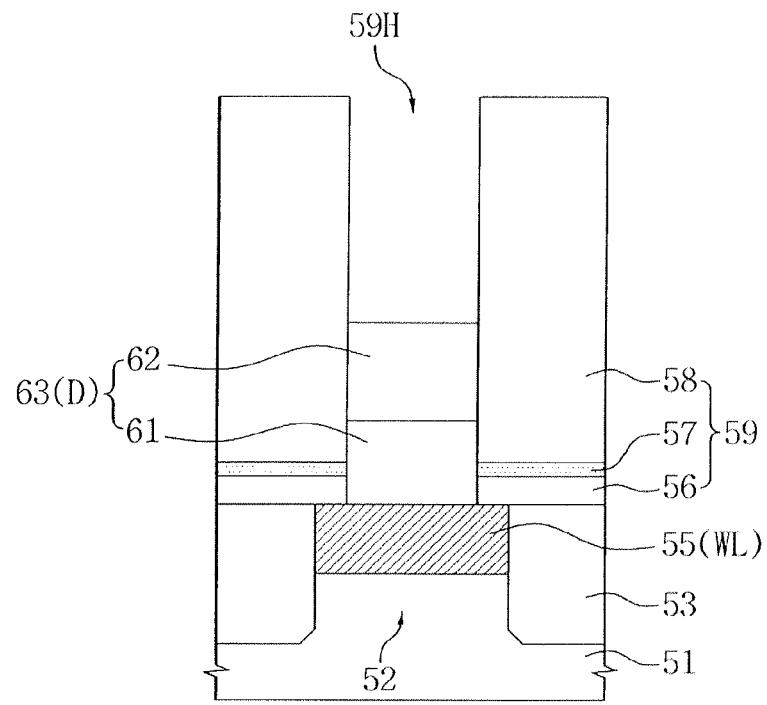

Referring to FIGS. 1, 3, and 6, a diode 63 (D) may be formed in the contact hole 59H (S20). The diode 63 (D) may serve as a switching device.

As shown in FIG. 6, after the semiconductor layer 60 is partially removed, first and second semiconductor patterns 61 and 62 may be formed by ion implantation. The first and second semiconductor patterns 61 and 62 may be sequentially stacked in the contact hole 59H. The first and second semiconductor patterns 61 and 62 may constitute the diode 63 (D).

The first semiconductor pattern 61 may be in contact with the word line 55 (WL). The first semiconductor pattern 61 may be formed to have impurity ions of the second conductivity type. The second semiconductor pattern 62 may be formed at a lower level than an upper surface of the insulation structure 59. That is, the diode 63 (D) may be formed in a lower region of the contact hole 59H. The second semiconductor pattern 62 may be exposed in the contact hole 59H. The second semiconductor pattern 62 may be formed to have impurity ions of the first conductivity type. The second semiconductor pattern 62 may be a conductive pattern containing silicon.

In another example embodiment, the first semiconductor pattern 61 may be formed to have impurity ions of the first conductivity type, and the second semiconductor pattern 62 may be formed to have impurity ions of the second conductivity type.

In still another example embodiment, the diode 63 (D) may be omitted.

Figure 7:
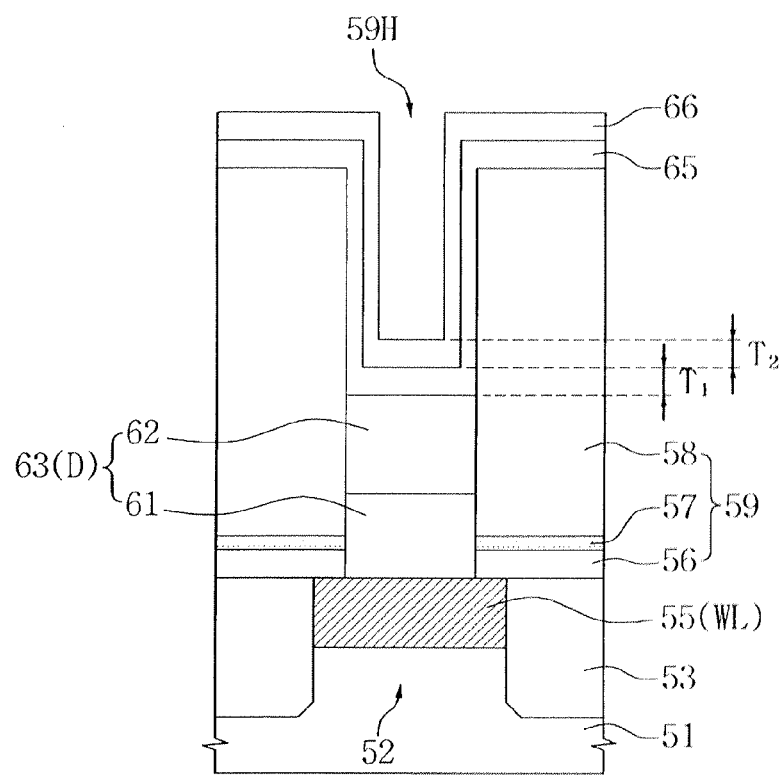

Referring to FIGS. 1, 3 and 7, a metal layer 65 and an alloying element layer 66 may be formed on the diode 63 (D) (see operation S30 in FIG. 1). As shown in FIG. 7, the contact hole 59H may have a high aspect ratio, and the metal layer 65 and the alloying element layer 66 may be formed to cover an inner wall of the contact hole 59H, but not to completely fill the contact hole 59H. That is, the contact hole 59H may become smaller in size of an opening due to the metal layer 65 and the alloying element layer 66.

The metal layer 65 may be formed to cover the inner wall of the contact hole 59H and the insulating structure 59. The metal layer 65 may be in direct contact with the second semiconductor pattern 62. The alloying element layer 66 may be formed to cover the metal layer 65. The alloying element layer 66 may be formed along a surface of the metal layer 65. The alloying element layer 66 may be in direct contact with the metal layer 65. The metal layer 65 may be formed to a thickness $T_1$ of 3 to 20 nm. The alloying element layer 66 may be formed to a thickness $T_2$ of 5 to 30 nm. The metal layer 65 may be formed of one of a material selected from the group consisting of titanium (Ti), cobalt (Co), tungsten (W), nickel (Ni), and tantalum (Ta). The alloying element layer 66 may be formed of carbon such as amorphous carbon.

The metal layer 65 and the alloying element layer 66 may be formed by CVD, cyclic chemical vapor deposition (cyclic CVD), atomic layer deposition (ALD), sputtering, or electron beam deposition.

In one example embodiment, the metal layer 65 may be a Ti layer. For example, the metal layer 65 may be formed by loading the substrate 51 into a process chamber and injecting a process gas such as $TiCl_4$ and a reactive gas such as $H_2$ into the process chamber. Subsequently, the alloying element layer 66 may be formed by injecting a carbon source gas such as $CH_4$, $C_2H_2$, $C_2H_4$, and/or $C_6H_6$, into the process chamber. The metal layer 65 and the alloying element layer 66 may be consecutively formed in the same chamber. Alternatively, the metal layer 65 and the alloying element layer 66 may be sequentially formed in different process chambers.

In another example embodiment, when the diode 63 (D) is omitted, the metal layer 65 may be in direct contact with the word line 55 (WL).

In still another example embodiment, the metal layers 65 and alloying element layers 66 may be alternatingly and repeatedly formed several times.

In yet another example embodiment, the alloying element layer 66 may be formed of silicon nitride (SiN).

Figure 8:
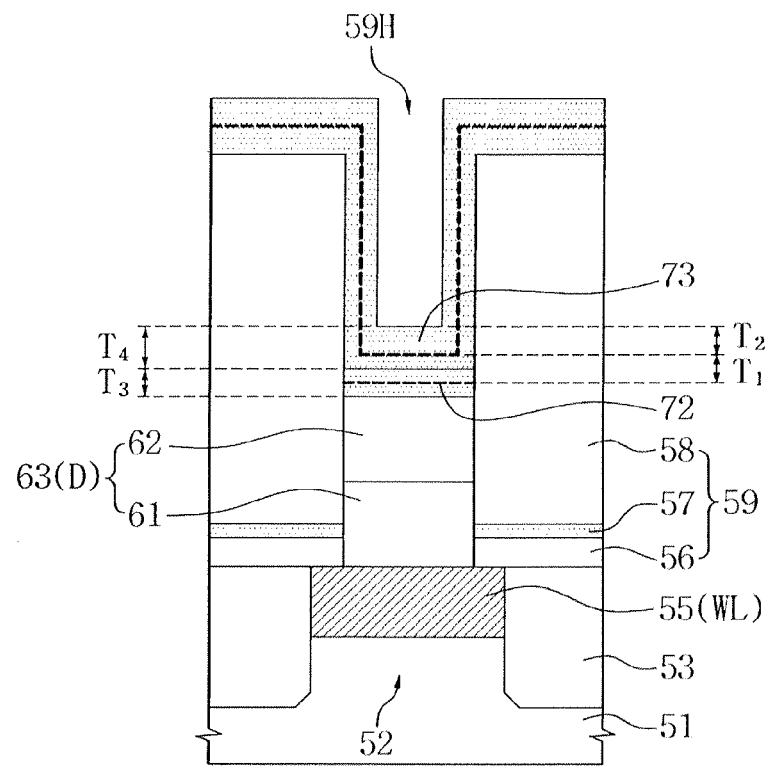

Referring to FIGS. 1, 3 and 8, the substrate 51 having the metal layer 65 and the alloying element layer 66 may be annealed to form a metal silicide layer 72 and a metal alloy layer 73 (see operation S40 in FIG. 1). The annealing may be performed at 500 to 800° C.

For example, the annealing may be formed at 600° C. for 30 to 3000 sec. The metal silicide layer 72 may serve as an ohmic layer.

During the annealing, the metal alloy layer 73 may be formed by reaction of the metal layer 65 and the alloying element layer 66, and the metal silicide layer 72 may be formed by reaction of the metal layer 65 and the second semiconductor pattern 62. Here, the metal silicide layer 72 may be formed between the second semiconductor pattern 62 and the metal alloy layer 73. The metal silicide layer 72 may be in direct contact with the second semiconductor pattern 62 and the metal alloy layer 73. The metal alloy layer 73 may be formed to cover the inner wall of the contact hole 59H and the upper surface of the insulating structure 59.

The metal silicide layer 72 may be formed of one of a material selected from the group consisting of titanium silicide (TiSi), cobalt silicide (CoSi), tungsten silicide (WSi), nickel silicide (NiSi), and tantalum silicide (TaSi). Here, the metal silicide layer 72 may be formed in various silicide-bonded structures, for example, $TiSi_2$, $CoSi_2$ and $NiSi_2$ layers, but the detailed description about this will be omitted for simplicity of explanation. The metal alloy layer 73 may be formed of metal carbide. For example, the metal alloy layer 73 may be formed of one of a material selected from the group consisting of TiC, CoC, WC, NiC, and TaC. In addition, the metal alloy layer 73 may be formed of one of a material selected from the group consisting of TiSiN, CoSiN, WSiN, NiSiN, and TaSiN. In the first example embodiment, the metal silicide layer 72 may be formed of TiSi, and the metal alloy layer 73 may be a TiC layer.

The formation and annealing of the metal layer 65 and the alloying element layer 66 may be consecutively performed in the same chamber. Alternatively, the formation and annealing of the metal layer 65 and the alloying element layer 66 may be sequentially performed in different process chambers.

Referring to FIGS. 1, 3, 8, and 9, the metal alloy layer 73 may be partially removed to form a lower electrode 73' (see operation S50 in FIG. 1).

Figure 9:
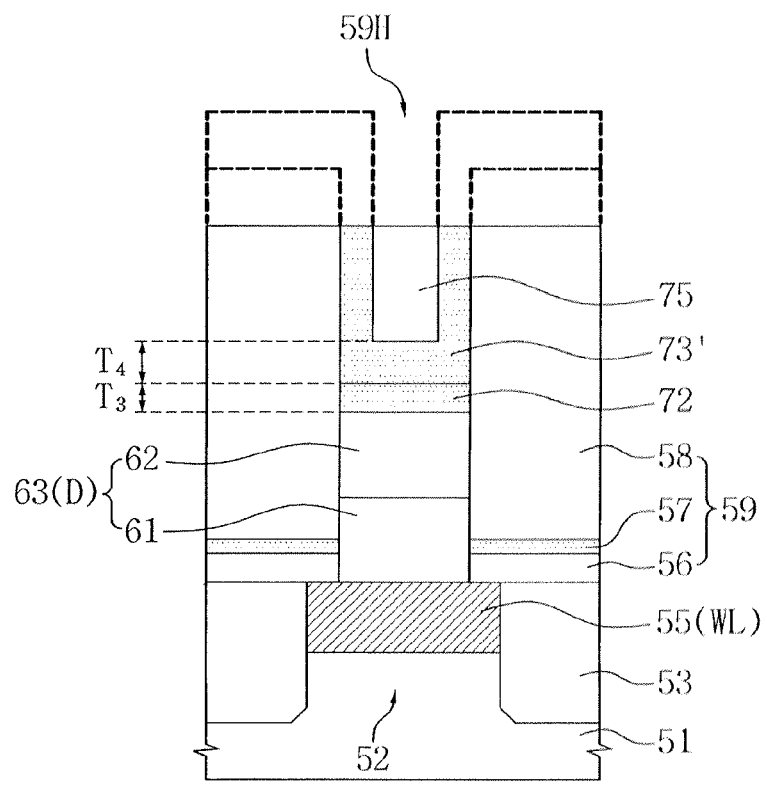

As shown in FIG. 9, a core layer 75 filling the contact hole 59H may be formed on the metal alloy layer 73. The core layer 75 may be an insulating layer, for example, formed of silicon nitride. The lower electrode 73' may be formed by planarizing the core layer 75 and the metal alloy layer 73. The planarization may be performed by chemical mechanical polishing (CMP), etch back, or a combination thereof. The core layer 75 may remain in the contact hole 59H. The lower electrode 73' may be interposed between the insulating structure 59 and the core layer 75. The upper surfaces of the lower electrode 73', the core layer 75 and the insulating structure 59 may be exposed on substantially the same plane. As seen from the plan view, the lower electrode 73' may be formed in a ring shape. The lower electrode 73' may be in direct contact with the metal silicide layer 72. The lower electrode 73' may be formed in a cup shape.

Figure 10:
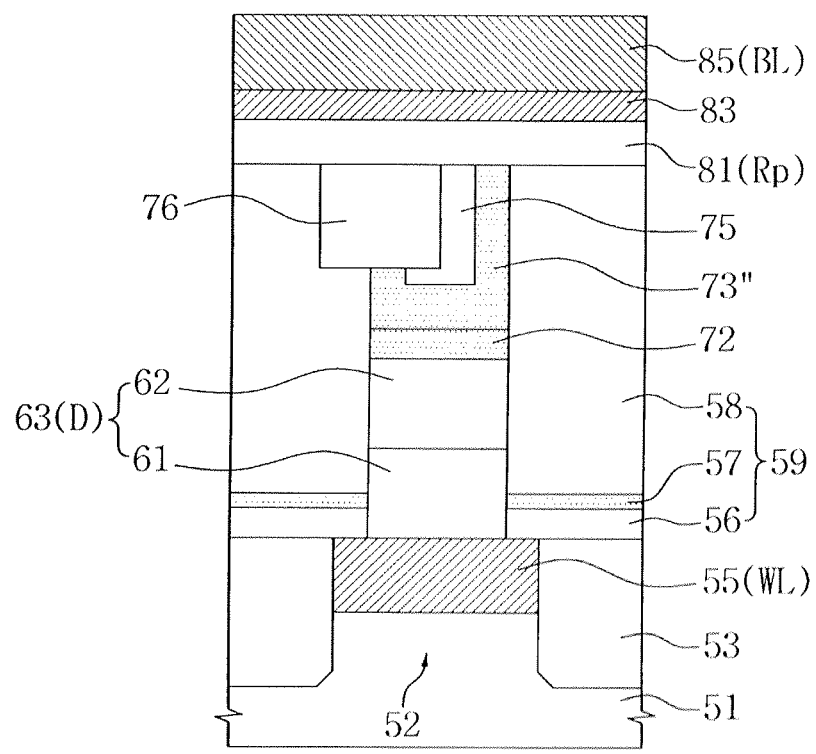

Referring to FIGS. 1, 3, 7, 9, and 10, the lower electrode 73' may be partially removed to form a reduced lower electrode 73". The reduced lower electrode 73" may be formed by patterning. For example, as shown in FIG. 10, the lower electrode 73', the core layer 75 and the insulating structure 59 may be partially removed by photolithography and etching processes to form an opening, and a buried insulating layer 76 filling the opening may be formed. The buried insulating layer 76 may be formed of silicon nitride, silicon oxide, silicon oxynitride, or a combination thereof. Upper surfaces of the reduced lower electrode 73", the buried insulating layer 76, the core layer 75 and the insulating structure 59 may be exposed on the same plane. As seen from the plan view, the reduced lower electrode 73" may be formed in a "C" shape. The reduced lower electrode 73" and the metal silicide layer 72 may be self-aligned to the second semiconductor pattern 62.

As described above, the lower electrode 73' and the reduced lower electrode 73" may be formed by removing parts of the metal alloy layer 73. That is, the lower electrode 73' and the reduced lower electrode 73" may be referred to as a metal carbide electrode or a metal silicon nitride electrode.

A data storage element such as a phase change material pattern 81 (Rp), which crosses the reduced lower electrode 73", may be formed on the insulating structure 59 (see operation S60 in FIG. 1). An upper electrode 83 may be formed on the phase change material pattern 81 (Rp). A bit line 85 (BL) may be formed on the upper electrode 83 (see operation S70 in FIG. 1).

As shown in FIG. 3, the phase change material pattern 81 (Rp) may be narrower than the reduced lower electrode 73". The phase change material pattern 81 (Rp) may be in direct contact with the reduced lower electrode 73". The phase change material pattern 81 (Rp) may be formed of a compound composed of at least two of the group consisting of Te, Se, Ge, Sb, Bi, Pb, Sn, Ag, As, S, Si, P, O and C. For example, the phase change material pattern 81 (Rp) may be formed of Ge—Sb—Te (GST).

The upper electrode 83 may cover the phase change material pattern 81 (Rp). The upper electrode 83 may be formed to have substantially the same width as the phase change material pattern 81 (Rp). The upper electrode 83 may be formed of one of a material selected from the group consisting of Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, Ru, CoSi, NiSi, a conductive carbon group, Cu, and a combination thereof. However, the upper electrode 83 may be omitted.

The bit line 85 (BL) may be in electrical contact with the phase change material pattern 81 (Rp). The bit line 85 (BL) may be formed of one of a material selected from the group consisting of Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, Ru, CoSi, NiSi, a conductive carbon group, Cu, and a combination thereof.

The semiconductor device according to the first example embodiment may be a phase change memory device.

In other example embodiments, the phase change material pattern 81 (Rp) may be replaced with one selected from the group consisting of a magnetic tunnel junction (MTJ) pattern, a polymer pattern and an oxide pattern. That is, the semiconductor device according to other example embodiments may be a non-volatile memory device such as a resistive memory.

According to the example embodiments described above, the substrate 51 having the metal layer 65 and the alloying element layer 66 of FIG. 7 may be annealed, thereby simultaneously forming the metal silicide layer 72 and the metal alloy layer 73 (see operation S40 in FIG. 1 and FIG. 8). The metal silicide layer 72 may be in direct contact with the second semiconductor pattern 62 and the metal alloy layer 73. The metal alloy layer 73 may serve as a heating device. Thus, the semiconductor device, which provides a simple process and has an excellent electrical characteristic, can be formed.

Figure 11:
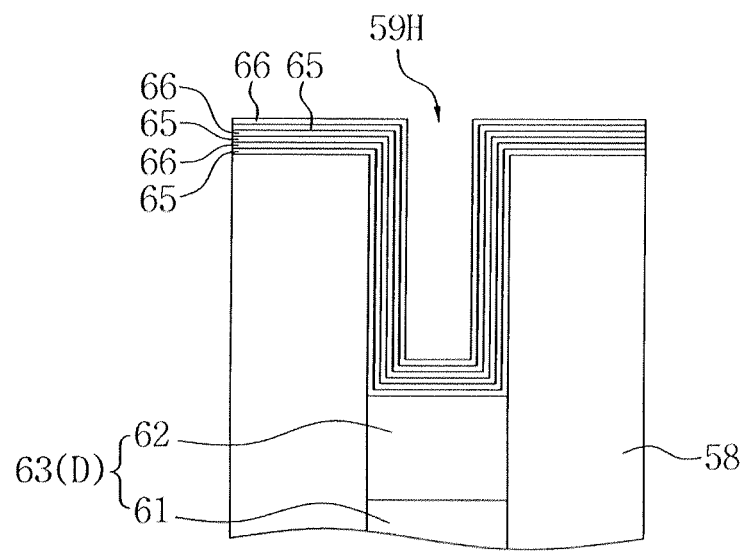
FIG. 11 is a cross-sectional view illustrating a method of forming a phase change memory device according to an example embodiment of the present general inventive concept.

FIG. 11 is a cross-sectional view illustrating a method of forming a phase change memory device according to an example embodiment.

Referring to FIG. 11, metal layers 65 and alloying element layers 66 may be formed on a diode 63 (D). As shown in FIG. 11, a plurality of metal layers 65 and a plurality of alloying element layers 66 may be alternatively and repeatedly formed. Among the metal layers 65, a first layer may be in contact with the diode 63 (D). Each metal layer 65 may be formed to a thickness of 0.1 to 2 nm. For example, each metal layer 65 may be formed to a thickness of about 1.5 nm. Each alloying element layer 66 may be formed to a thickness of about 0.1 to 2 nm. For example, each alloying element layer 66 may be formed to a thickness of about 1.5 nm.

FIGS. 12 through 15 are cross-sectional views illustrating a method of forming a phase change memory device according to another embodiment.

Figure 12:
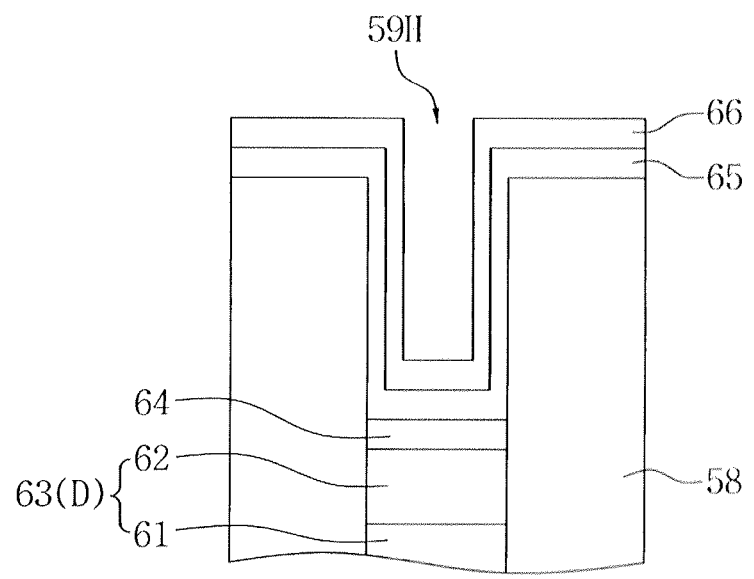
FIGS. 12 through 15 are cross-sectional views illustrating a method of forming a phase change memory device according to an example embodiment of the present general inventive concept.

Referring to FIG. 12, a diode electrode 64 may be formed on a diode 63 (D). The diode electrode 64 may be in direct contact with the diode 63 (D). The diode electrode 64 may be self-aligned to the diode 63 (D) in a contact hole 59H. The diode electrode 64 may be formed of one of a material selected from the group consisting of CoSi, TiSi, WSi, NiSi, and TaSi. The diode electrode 64 may serve as an ohmic layer.

A metal layer 65 and an alloying element layer 66 may be sequentially formed on the diode electrode 64.

Figure 13:
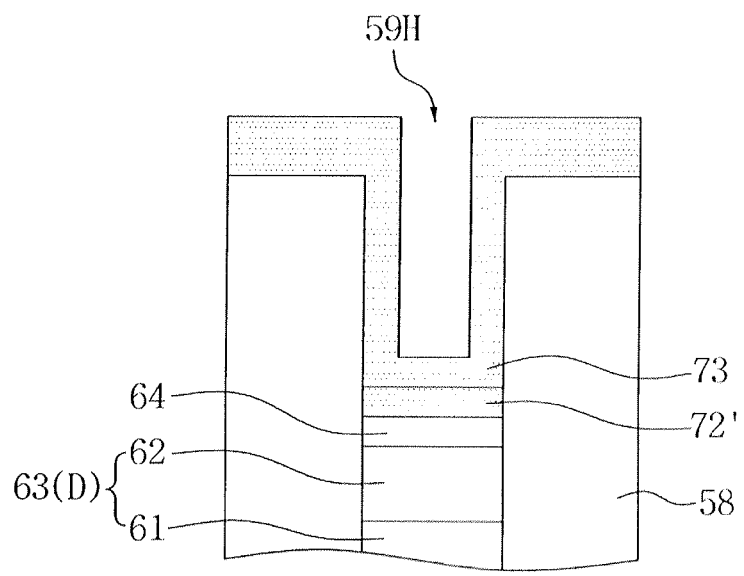

Referring to FIG. 13, a substrate having the metal layer 65 and the alloying element layer 66 may be annealed, thereby forming a metal silicide layer 72' and a metal alloy layer 73, respectively. The annealing may be performed at a temperature of 500 to 800° C. For example, the annealing may be performed at 600° C. for 30 to 3000 sec. The metal silicide layer 72' may serve as an ohmic layer.

During the annealing, the metal alloy layer 73 may be formed by reaction of the metal layer 65 and the alloying element layer 66, and the metal silicide layer 72' may be formed by reaction of the metal layer 65 and the diode electrode 64. Here, the metal silicide layer 72' may be formed between the diode electrode 64 and the metal alloy layer 73. The metal silicide layer 72' may be in direct contact with the diode electrode 64 and the alloy metal layer 73.

The metal silicide layer 72' may be formed of one of a material selected from the group consisting of TiSi, CoSi, WSi, NiSi, and TaSi. The metal alloy layer 73 may be formed of metal carbide. For example, the metal alloy layer 73 may be formed of one of a material selected from the group consisting of TiC, CoC, WC, NiC, and TaC. Alternatively, the metal alloy layer 73 may be formed of one selected from the group consisting of TiSiN, CoSiN, WSiN, NiSiN, and TaSiN.

Figure 14:
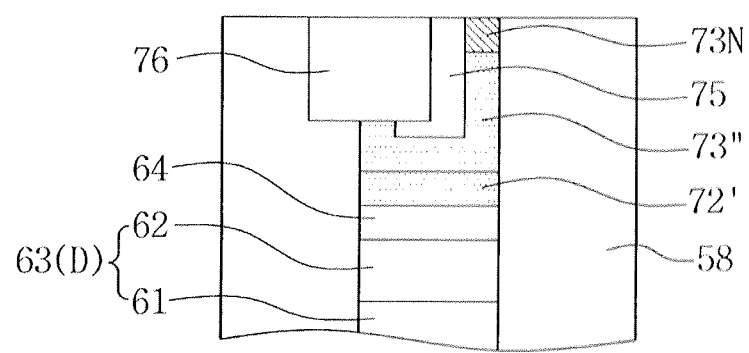

Referring to FIG. 14, a core layer 75, a buried insulating layer 76, a lower electrode 73", and a nitride alloy layer 73N may be formed.

Specifically, the core layer 75, the buried insulating layer 76, and the lower electrode 73" may be formed by a similar method to that described above. Here, upper surfaces of the core layer 75, the buried insulating layer 76, and the reduced lower electrode 73" may be exposed on substantially the same plane. Subsequently, the nitride alloy layer 73N may be formed on the exposed surface of the lower electrode 73" using nitridation. The nitride alloy layer 73N may be formed of one of a material selected from the group consisting of TiCN, CoCN, WCN, NiCN, and TaCN. In the third example embodiment, the nitride alloy layer 73N may be a TiCN layer. The nitride alloy layer 73N may be formed to cover the upper surface of the lower electrode 73".

In some other example embodiments, the nitride alloy layer 73N may be omitted.

Figure 15:
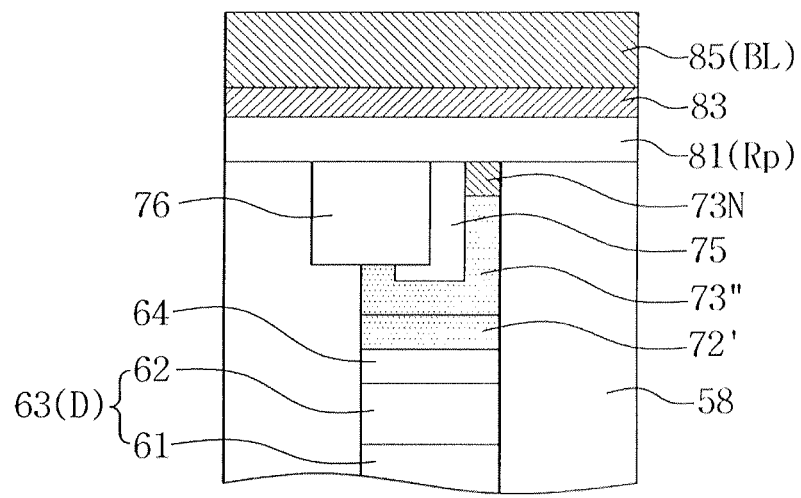

Referring to FIG. 15, a phase change material pattern 81 (Rp), an upper electrode 83, and a bit line 85 (BL) may be formed on the nitride alloy layer 73N. The phase change material pattern 81 (Rp) may be in direct contact with the nitride alloy layer 73N.

Figure 16:
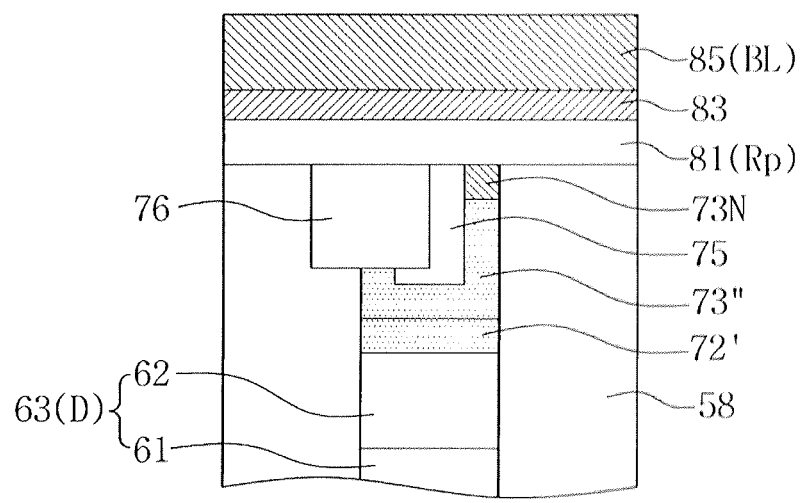
FIG. 16 is a cross-sectional view illustrating a method of forming a phase change memory device according to an example embodiment of the present general inventive concept.

FIG. 16 is a cross-sectional view illustrating a method of forming a phase change memory device according to another embodiment.

Referring to FIG. 16, a metal silicide layer 72' may be in direct contact with a second semiconductor pattern 62. By a similar method to that described above, a core layer 75, a buried insulating layer 76, a lower electrode 73", a nitride alloy layer 73N, a phase change material pattern 81 (Rp), an upper electrode 83, and a bit line 85 (BL) may be formed.

Figure 17:
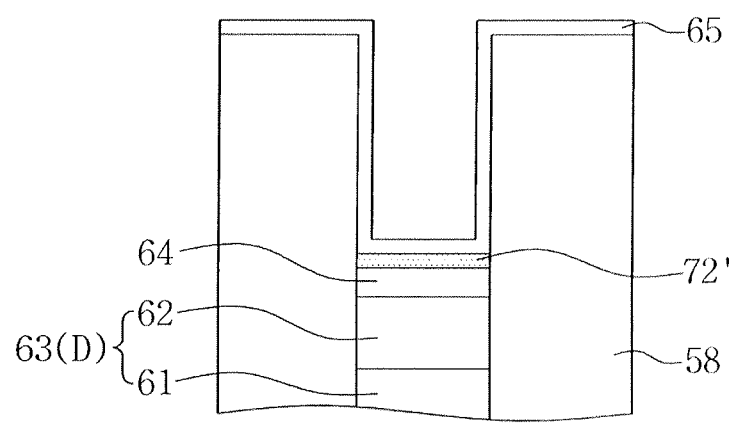
FIGS. 17 through 19 are cross-sectional views illustrating a method of forming a phase change memory device according to an example embodiment of the present general inventive concept.
Figure 18:
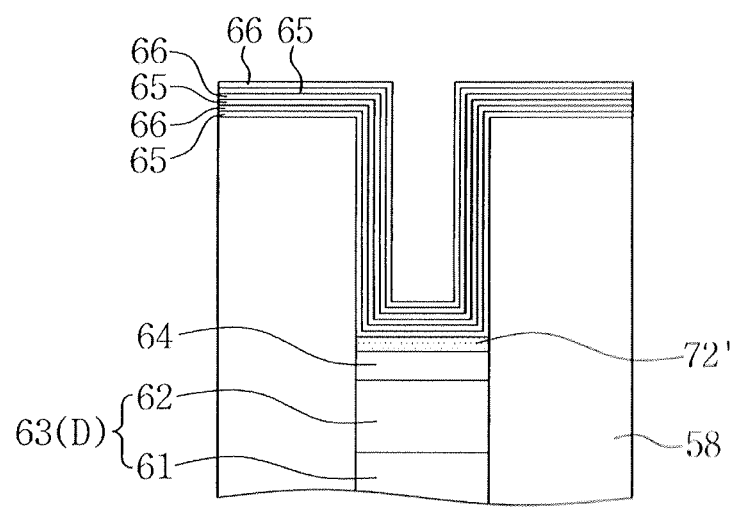
Figure 19:
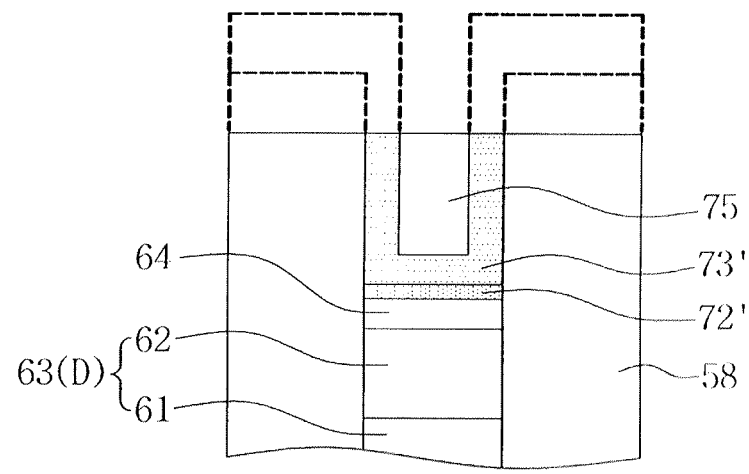

FIGS. 17 through 19 are cross-sectional views illustrating a method of forming a phase change memory device according to another embodiment.

Referring to FIG. 17, a diode electrode 64 may be formed on a diode 63 (D). The diode electrode 64 may be in direct contact with the diode 63 (D). The diode electrode 64 may cover a second semiconductor pattern 62 of the diode 63 (D). The diode electrode 64 may be formed of one of a material selected from the group consisting of CoSi, TiSi, WSi, NiSi, and TaSi. For example, the diode electrode 64 may be a CoSi layer.

A metal layer 65 may be formed on the diode electrode 64. During the formation of the metal layer 65, a metal silicide layer 72' may be formed on the diode electrode 64. Here, the metal silicide layer 72' may be interposed between the metal layer 65 and the diode electrode 64.

The metal layer 65 may be formed by CVD, cyclic CVD, ALD, sputtering, or electron beam deposition. For example, the metal layer 65 may be formed at 500 to 800° C. by CVD or cyclic CVD.

In some other example embodiments, when the diode electrode 64 is omitted, the metal silicide layer 72' may be in direct contact with the second semiconductor pattern 62.

Referring to FIGS. 18 and 19, a plurality of alloying element layers 66 and a plurality of other metal layers 65 may be alternatingly and repeatedly formed on the metal layer 65. By a similar method to that described above, a core layer 75 and a lower electrode 73' may be formed.

FIGS. 20 through 23 are cross-sectional views illustrating a method of forming a phase change memory device according to another embodiment.

Figure 20:
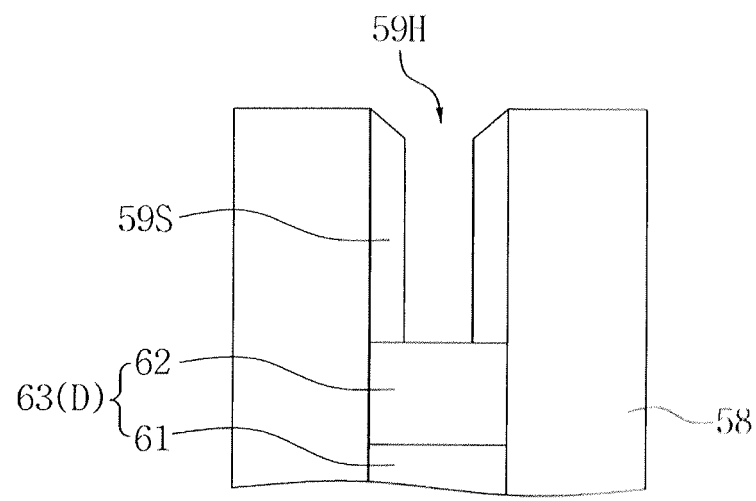
FIGS. 20 through 23 are cross-sectional views illustrating a method of forming a phase change memory device according to an example embodiment of the present general inventive concept.

Referring to FIG. 20, a spacer 59S may be formed on a sidewall of a contact hole 59H. The spacer 59S may be formed of silicon nitride, silicon oxide, silicon oxynitride, or a combination thereof. A diameter of the contact hole 59H may become smaller due to the spacer 59S. That is, the spacer 59S may partially cover an upper surface of a second semiconductor pattern 62.

Figure 21:
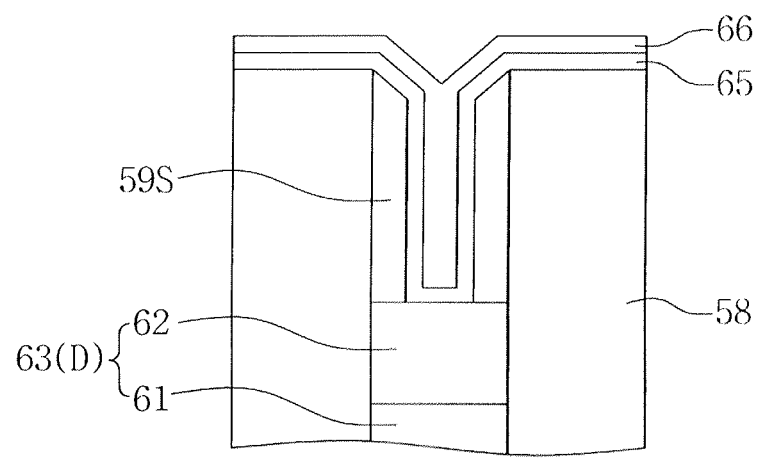

Referring to FIG. 21, by a similar method to that described above, a metal layer 65 and an alloying element layer 66 may be sequentially formed on the second semiconductor pattern 62. Here, the metal layer 65 and the alloying element layer 66 may be formed to completely fill the contact hole 59H. The metal layer 65 may be in direct contact with the second semiconductor pattern 62.

Figure 22:
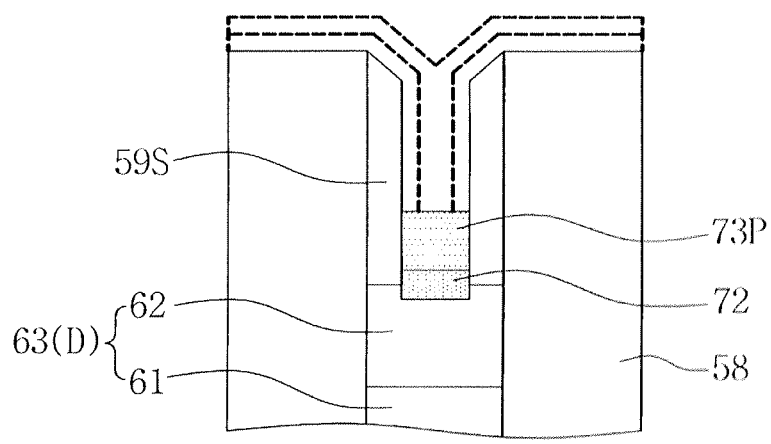

Referring to FIG. 22, a substrate having the metal layer 65 and the alloying element layer 66 may be annealed, thereby forming a metal silicide layer 72 and a metal alloy layer.

Subsequently, the metal alloy layer may be etched-back, thereby forming a lower electrode 73P. The lower electrode 73P may be formed in a pillar shape. The lower electrode 73P may be formed in the contact hole 59H. The lower electrode 73P may be formed at a lower level than an upper surface of the interlayer insulating layer 58. The metal silicide layer 72 may be formed between the second semiconductor pattern 62 and the lower electrode 73P. The metal silicide layer 72 may be in contact with the second semiconductor pattern 62 and the lower electrode 73P. The metal silicide layer 72 and the lower electrode 73P may be self-aligned to the diode 63.

Figure 23:
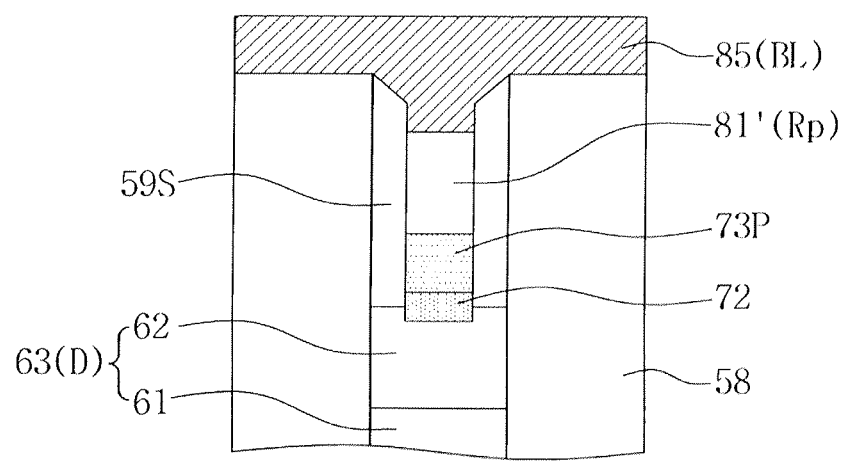

Referring to FIG. 23, a phase change material pattern 81' (Rp) and a bit line 85 (BL) may be formed on the lower electrode 73P. The phase change material pattern 81' (Rp) may be formed in the contact hole 59H. The phase change material pattern 81' (Rp) may be formed at a lower level than the upper surface of the interlayer insulating layer 58. The bit line 85 (BL) may be formed to extend in the contact hole 59H. The bit line 85 (BL) may be in contact with the phase change material pattern 81' (Rp). The phase change material pattern 81' (Rp) may be in contact with the lower electrode 73P and the bit line 85 (BL).

Figure 24:
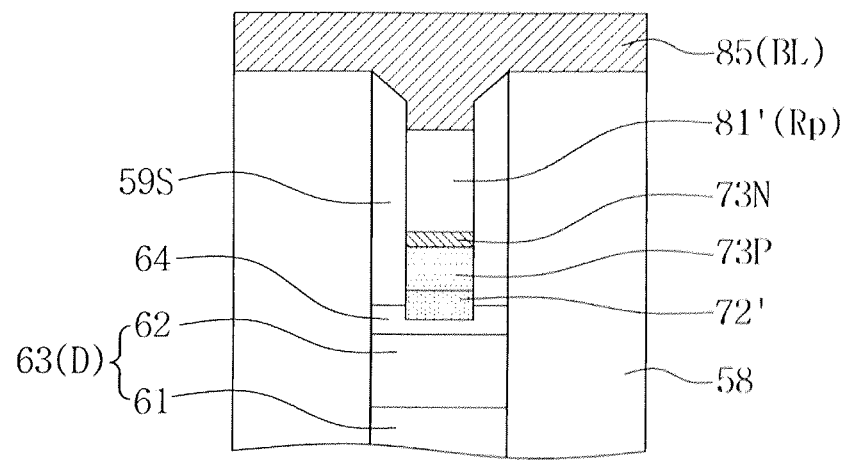
FIG. 24 is a cross-sectional view illustrating a method of forming a phase change memory device according to an example embodiment of the present general inventive concept.

FIG. 24 is a cross-sectional view illustrating a method of forming a phase change memory device according to another embodiment. Referring to FIG. 24, a diode electrode 64, a spacer 59S, a metal silicide layer 72', a lower electrode 73P, a nitride alloy layer 73N, a phase change material pattern 81' (Rp), and a bit line 85 (BL) may be formed on a diode 63 (D).

Figure 25:
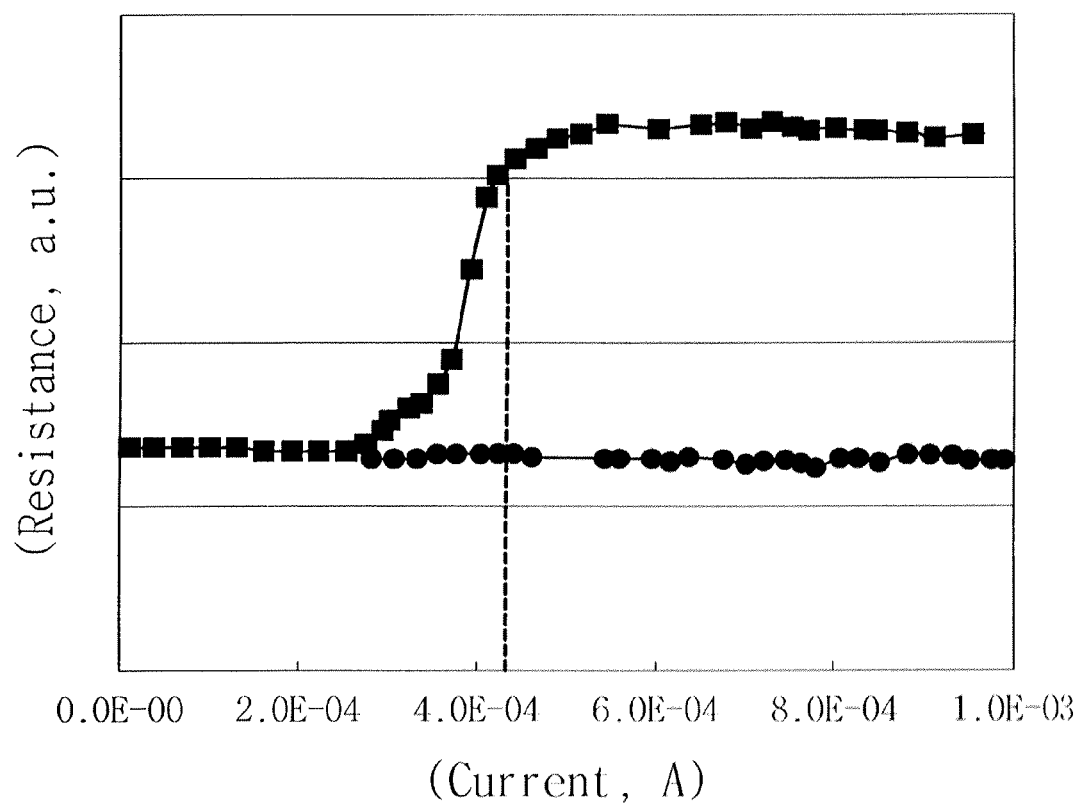
FIGS. 25 and 26 show transition characteristics of the phase change memory device according to an example embodiment of the present general inventive concept.
Figure 26:
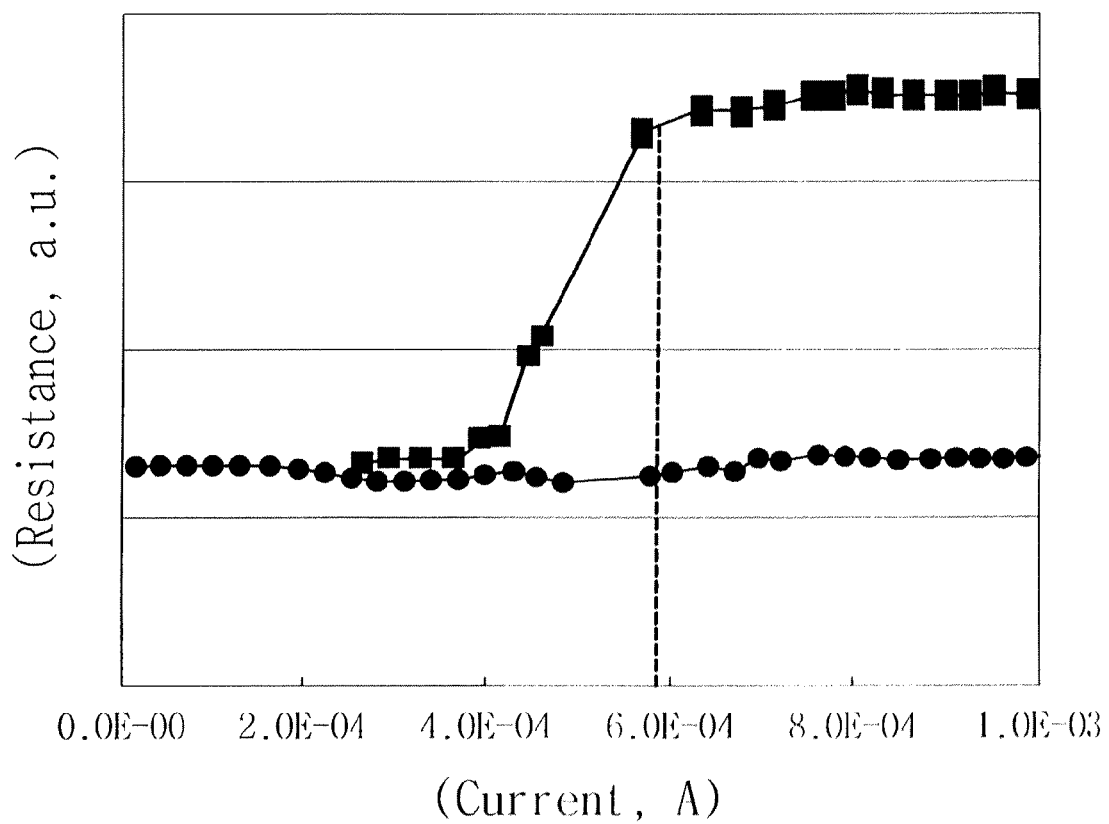

FIGS. 25 and 26 show transition characteristics of the phase change memory device according to the embodiment illustrated in FIG. 10. Referring to FIG. 25 (with reference to the phase change memory device of FIGS. 7-10, for example), the metal layer 65 is formed to a thickness of 5 nm using Ti, the alloying element layer 66 is formed to a thickness of 20 nm using amorphous carbon. Subsequently, these layers are annealed at 600° C., thereby forming the metal silicide layer 72 and the metal carbide layer. A phase change memory device, which is similar to that of FIG. 10, is formed, and the transition characteristics are tested. In FIG. 25, the horizontal axis represents a current value applied to the phase change memory device, and the unit of scale is Amperes. In FIG. 25, the vertical axis represents a resistance value measured at the phase change memory device, and the unit of scale is an arbitrary unit (a.u.). As shown in FIG. 25, the phase change memory device shows a reset current of about 0.4 mA.

Referring to FIG. 26 (with reference to the phase change memory device of FIGS. 7-10, for example), the metal layer 65 is formed to a thickness of 10 nm using Ti, and the alloying element layer 66 is formed to a thickness of 20 nm using amorphous carbon. Subsequently, these layers are annealed at 600° C., thereby forming the metal silicide layer 72 and the metal carbide layer, respectively. Other processing conditions are substantially the same as those used to illustrate FIG. 25. That is, a phase change memory device, which is similar to that of FIG. 10, is formed, and the transition characteristics are tested. In FIG. 26, the horizontal axis represents a current value applied to the phase change memory device, and the unit of scale is Amperes. In FIG. 26, the vertical axis represents a resistance value measured at the phase change memory device, and the unit of a scale is an arbitrary unit (a.u.). As shown in FIG. 26, the phase change memory device shows a reset current of about 0.6 mA Referring to FIGS. 25 and 26, the reset current of the phase change memory device may be controlled by adjusting thicknesses of the metal layer 65 and the alloying element layer 66.

Figure 27:
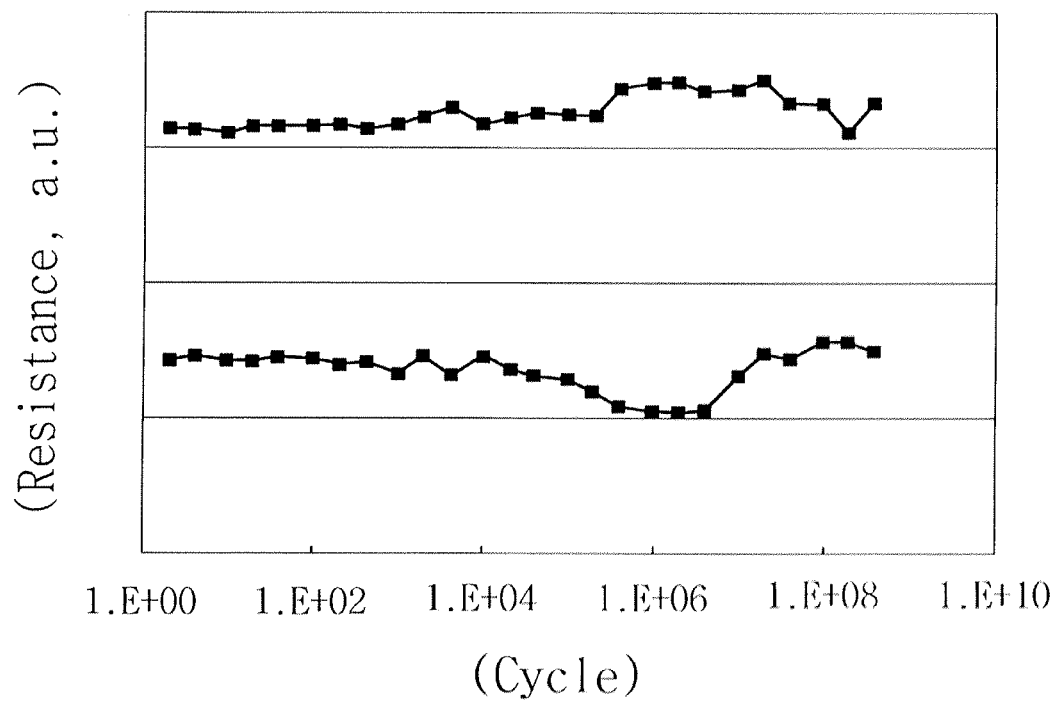
FIG. 27 shows a repetitive endurance characteristic of the phase change memory device according to an example embodiment of the present general inventive concept.

FIG. 27 shows repetitive endurance characteristics of the phase change memory device according to the embodiment illustrated in FIG. 10.

Referring to FIG. 27 (with reference to the phase change memory device of FIGS. 7-10, for example), the metal layer 65 is formed to a thickness of 5 nm using Ti, and the alloying element layer 66 is formed to a thickness of 20 nm using amorphous carbon. Subsequently, these layers are annealed at 600° C., thereby forming the metal silicide layer 72 and the metal carbide layer, respectively. That is, a phase change memory device, which is similar to that of FIG. 10, is formed, and the repetitive endurance is tested. In FIG. 26, the horizontal axis represents the number of operating tests performed on the phase change memory device, and the unit of scale is a Cycle. In FIG. 26, the vertical axis represents a resistance value measured at the phase change memory device, and the unit of scale is an arbitrary unit (a.u.). As shown in FIG. 27, the phase change memory device passes the repetitive endurance test of 4E8. That is, the phase change memory device according to the example embodiment has excellent repetitive endurance.

Figure 28:
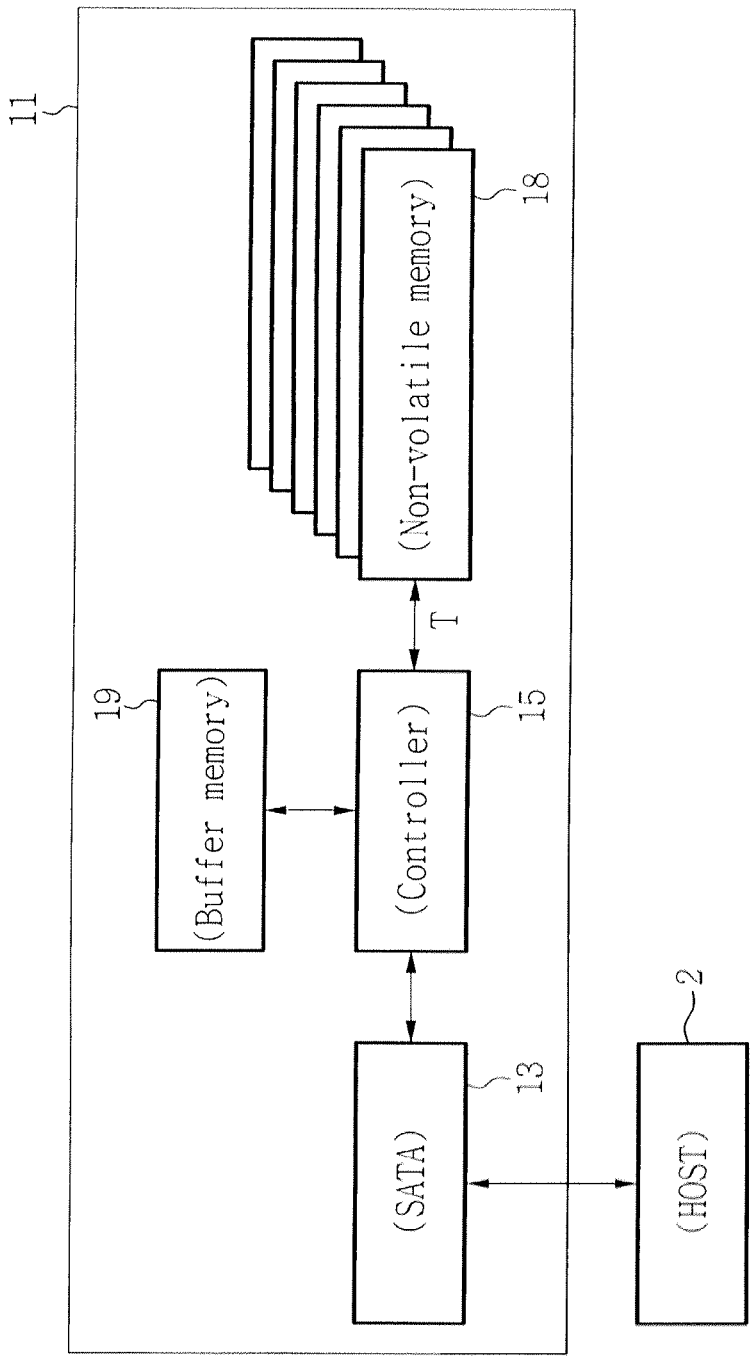
FIGS. 28 and 29 are schematic block diagrams of electronic systems according to example embodiments of the present general inventive concept.

FIG. 28 is a schematic block diagram of an electronic system according to another embodiment. The electronic system may be a data storage device such as a solid state disk (SSD) 11. Referring to FIG. 28, the solid state disk (SSD) 11 may include an interface 13, a controller 15, a non-volatile memory 18, and a buffer memory 19. The non-volatile memory 18 may include the metal silicide layer 72 and/or the metal alloy layer 73, as described above. The non-volatile memory 18 may be a resistive memory. For example, the non-volatile memory 18 may include a data storage element such as one selected from the phase change material pattern 81 (Rp), a magnetic tunnel junction (MTJ) pattern, a polymer pattern, and an oxide pattern. The phase change material pattern 81 (Rp), the magnetic tunnel junction (MTJ) pattern, the polymer pattern, and the oxide pattern may be in electrical contact with the metal alloy layer 73.

The solid state disk 11 is a device storing data using a semiconductor. The solid state disk 11 has a high speed, less mechanical delay, a low failure rate, and less heat and noise, and is formed in a smaller and lighter structure, compared to a hard disk drive (HDD). The solid state disk 11 may be used for notebook computers, desktop computers, MP3 players, or portable storage devices.

The controller 15 may be adjacent to and in electrical contact with the interface 13. The controller 15 may include a memory controller and a buffer controller. The non-volatile memory 18 may be adjacent to and in electrical contact with the controller 15. A data storage capacity of the solid state disk 11 may correspond to that of the non-volatile memory 18. The buffer memory 19 may be adjacent to and in electrical contact with the controller 15.

The interface 13 may be in contact with a host 2, and serve to transmit and receive electric signals such as data. For example, the interface 13 may be a device using standards such as SATA, IDE, SCSI, and/or a combination thereof. The non-volatile memory 18 may be in contact with the interface 13 via the controller 15. The non-volatile memory 18 may serve to store data received by the interface 13. Although power supply to the solid state disk 11 is interrupted, the data stored in the non-volatile memory 18 is retained.

The buffer memory 19 may include a volatile memory. The volatile memory may be dynamic random access memory (DRAM), and/or static random access memory (SRAM). The buffer memory 19 has a relatively higher operating speed than the non-volatile memory 18.

A data processing rate of the interface 13 may be relatively higher than the operating speed of the non-volatile memory 18. Here, the buffer memory 19 may serve to temporarily store data. The data received by the interface 13 is temporarily stored in the buffer memory 19 via the controller 15, and permanently stored in the non-volatile memory 18 at a data writing speed of the non-volatile memory 18. Frequently-used data of the data stored in the non-volatile memory device 18 may be read previously, and temporarily stored in the buffer memory 19. That is, the buffer memory 19 may increase an effective operating speed of the solid state disk 11, and reduce an error rate.

Figure 29:
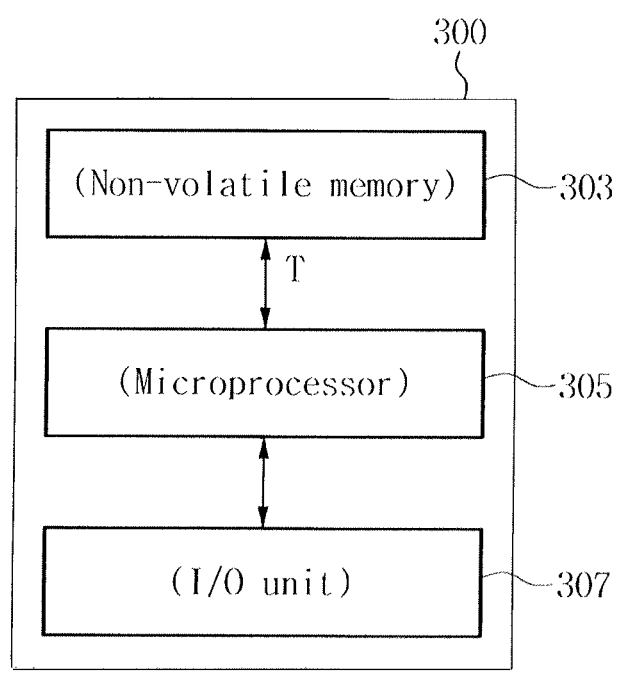

FIG. 29 is a schematic block diagram of an electronic system 300 according to another embodiment. The electronic system 300 may include a non-volatile memory 303 and a microprocessor 305 electrically connected to the non-volatile memory 303. Here, the non-volatile memory 303 may include the metal silicide layer 72 and/or the metal alloy layer 73 as described above. The non-volatile memory 303 may be a resistive memory. For example, the non-volatile memory 303 may include a data storage element such as one selected from the group consisting of the phase change material pattern 81 (Rp), a magnetic tunnel junction (MTJ) pattern, a polymer pattern, and an oxide pattern. The phase change material pattern 81 (Rp), the magnetic tunnel junction (MTJ) pattern, the polymer pattern, and the oxide pattern may be in electrical contact with the metal carbide layer 73.

The electronic system 300 may correspond to a part of a notebook computer, a digital camera, or a mobile phone. Here, the microprocessor 305 and the non-volatile memory 303 may be installed on a board, and the non-volatile memory 303 may serve as data storage media to operate the microprocessor 305.

The electronic system 300 may exchange data with another electronic system such as a personal computer or a computer network using input/output devices 307. The input/output devices 307 may provide data through a peripheral bus line of a computer, a high speed digital transmission line, or a wireless transmitting/receiving antenna. Data communications between the microprocessor 305 and the non-volatile memory 303, and between the microprocessor 305 and the input/output devices 307 may be performed using typical bus architectures.

Figure 30:
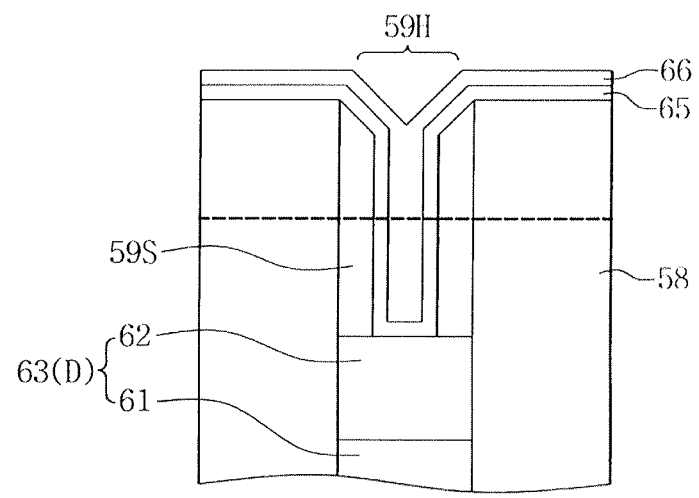
FIGS. 30 through 33 are cross-sectional views illustrating a method of forming a phase change memory device according to another example embodiment of the present general inventive concept.
Figure 31:
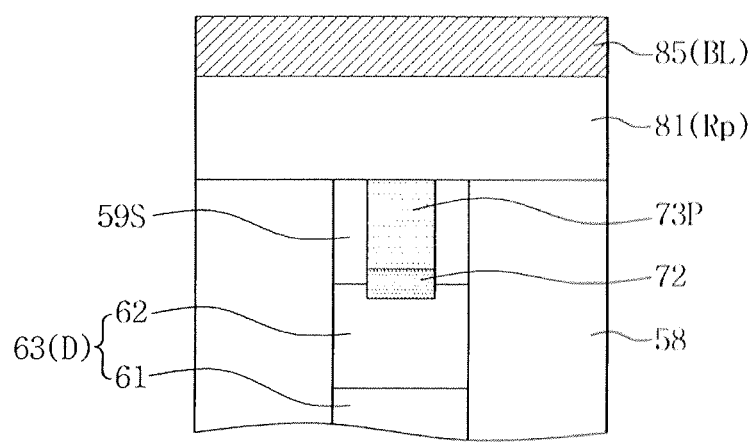

FIGS. 30 and 31 are cross-sectional views illustrating a method of forming a phase change memory device according to another example embodiment of the present general inventive concept. Referring to FIG. 30, a spacer 59S may be formed on a sidewall of the contact hole 59H. A metal layer 65 and an alloying element layer 66 may be sequentially formed inside of the spacer 59S on the second semiconductor pattern 62. The spacer 59S along with the metal layer 65 and the alloying element layer 66 may be formed to fill the contact hole 59H.

An upper portion of the insulating layer 58, spacer 59S, metal layer 65, and alloying element layer 66 may be cut away, etched, or otherwise removed along a plane between the second semiconductor layer 62 and an upper end of the insulating layer 58.

Referring to FIG. 31, a phase change material pattern 81 (Rp) may be formed on top of the contact hole 59H to contact and cover the spacer 59S, the lower electrode 73, and an interlayer insulating layer 58. A bit line 85 (BL) may be formed on top of the phase change material pattern 81 (Rp) to contact and cover the phase change material pattern 81 (Rp).

Figure 32:
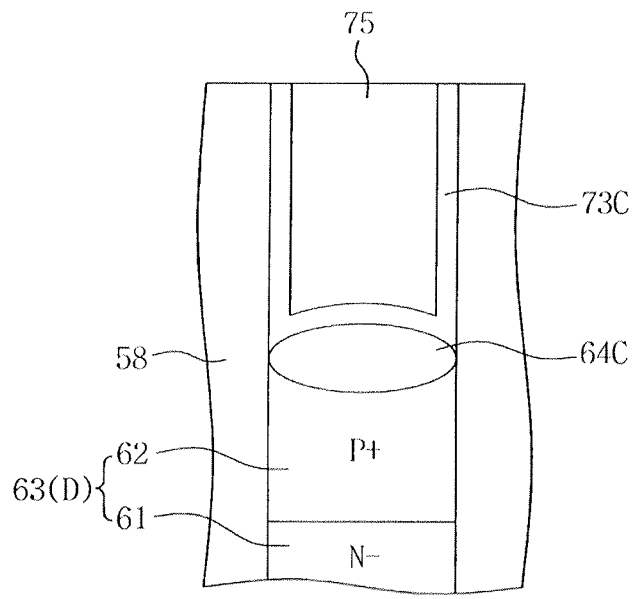

Referring to FIG. 32, according to an embodiment of the present general inventive concept, a metal alloy layer 73C may be formed directly between the diode electrode 64C and the core layer 75. As described previously in FIG. 12, for example, the diode electrode 64C may be formed on the second semiconductor layer 62. An alloying element layer 66 may be formed directly on the diode electrode to cover the sides of the contact hole 59H. The substrate 51 including the second semiconductor layer 62 and diode electrode 64C may be annealed to form the metal alloy layer 73C illustrated in FIG. 32. In other words, an alloying element layer 66 may combine with or alloy with edge portions of the diode electrode 64C.

Figure 33:
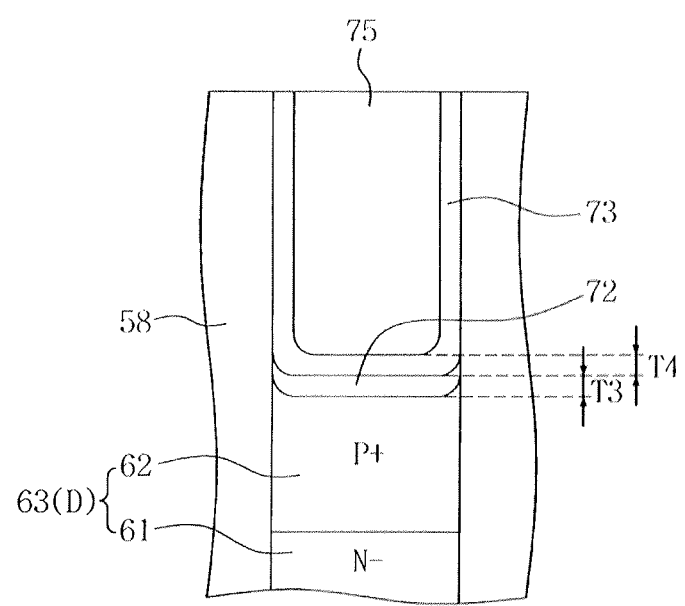

Referring to FIG. 33, when the diode electrode is omitted, as described above with reference to FIGS. 7 and 8, the substrate may be annealed to form a metal silicide layer 72 of a thickness T3 that includes an alloy or combination of a metal layer and the second semiconductor portion 62. A metal alloy layer 73 of a thickness T4 may be formed of a metal layer and an alloying element layer, as illustrated in FIGS. 7 and 8. Upon being annealed, the core layer 75 may be formed in the exposed center portion of the contact hole 59H.

As illustrated in FIGS. 32 and 33, edges of the metal alloy layer 73 and metal silicide layer 72 may have different shapes, including convex, concave, or substantially linear shapes, depending on design parameters such as shapes of the second semiconductor layer 62 and the diode electrode 64.

Figure 34:
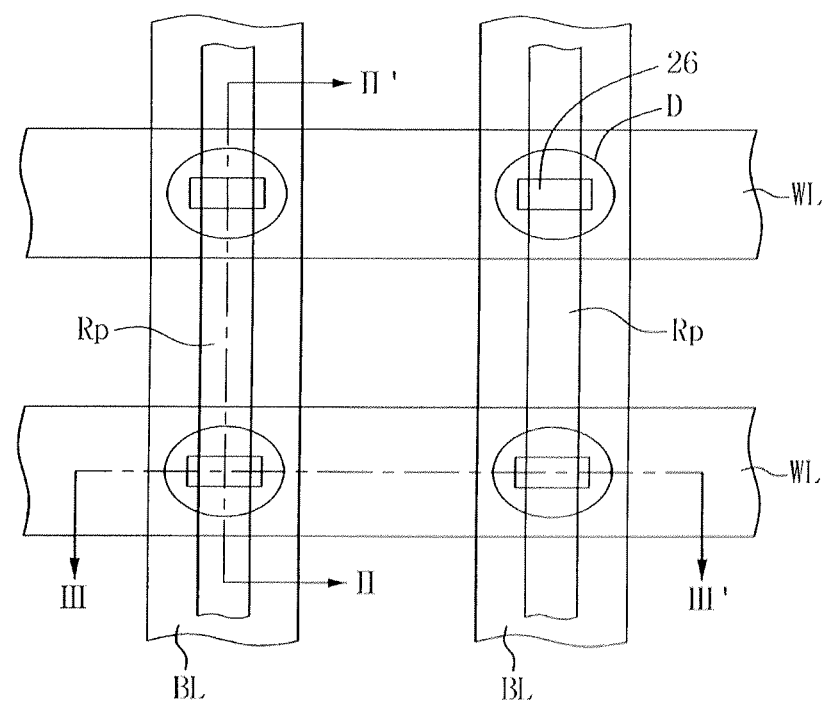
FIG. 34 is a phase change memory device according to another example embodiment of the present general inventive concept.

FIGS. 34-43 illustrate a phase change memory device according to another example embodiment of the present general inventive concept. FIG. 34 illustrates a plan view of the phase change memory device, and FIGS. 35-43 illustrate cross-section views of the phase change memory device.

Referring to FIG. 34, the phase change memory device may include bit lines BL formed parallel to each other in a first direction, word lines WL formed parallel to each other in a second direction perpendicular to the first direction, and a plurality of phase change material patterns Rp formed parallel to each other and the bit lines BL and positioned between the bit lines BL and the word lines WL. At a juncture of the bit lines BL and word lines WL lower electrodes 26 and diodes D may be formed. Each phase change material pattern Rp may be in electrical contact with a corresponding one of the bit lines BL. Each diode may be in electrical contact with a corresponding one of the word lines WL. The diodes D may serve as switching devices. The phase change material patterns Rp may serve as data storage elements. As such, the bit lines BL may be in electrical contact with the word lines WL via the phase change material patterns Rp, the lower electrode and the diodes D.

Figure 35:
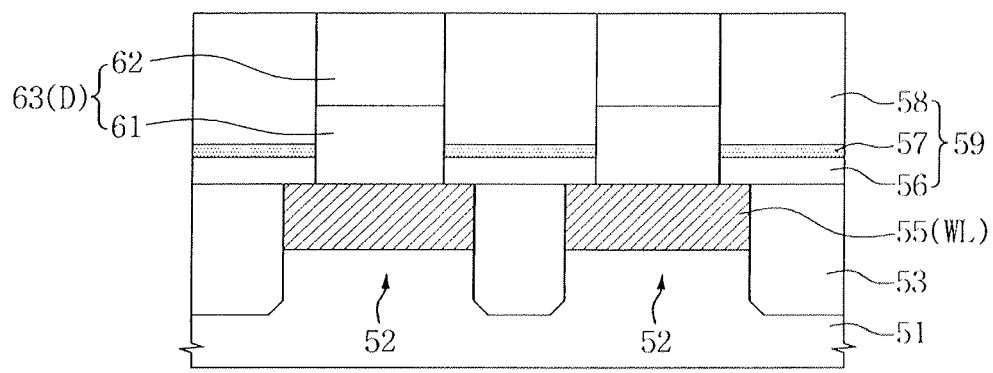
FIGS. 35 through 45 are cross-sectional views illustrating a method of forming a phase change memory device according to another example embodiment of the present general inventive concept.
Figure 36:
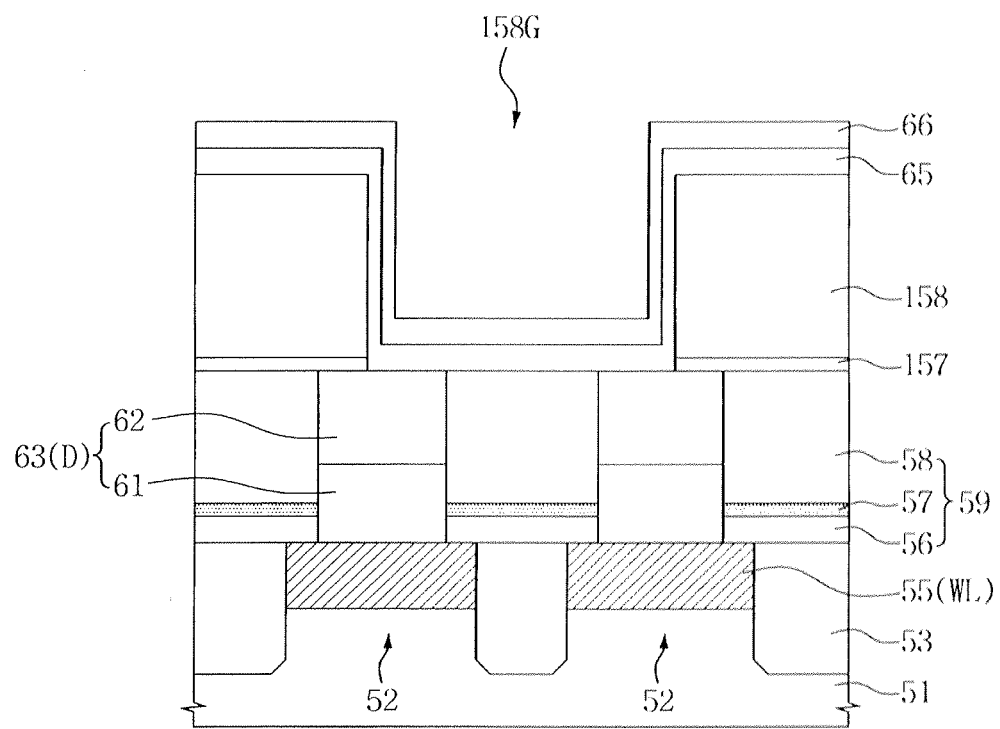
Figure 39:
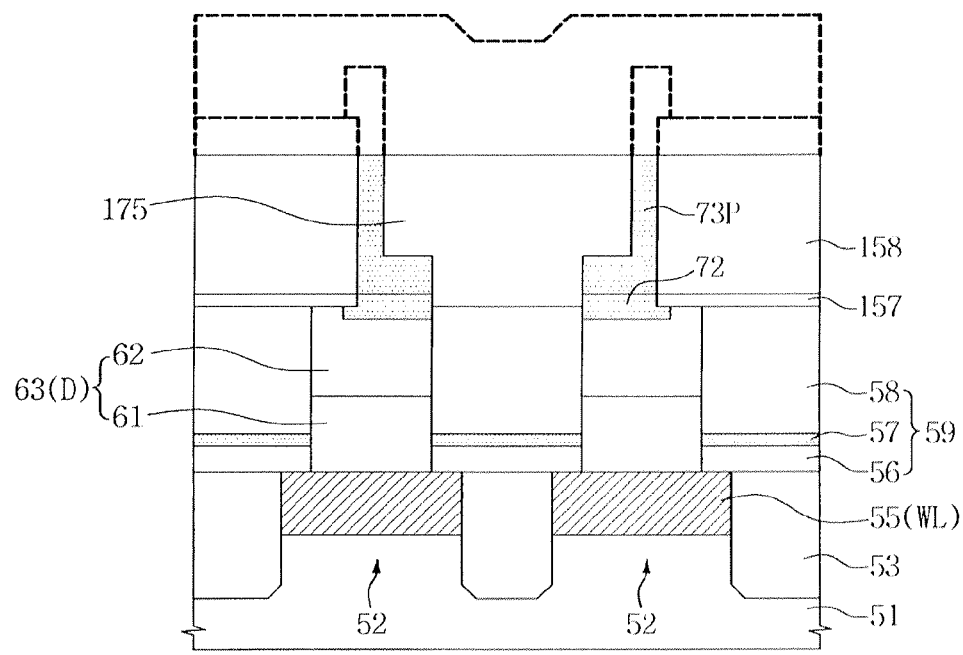
Figure 40:
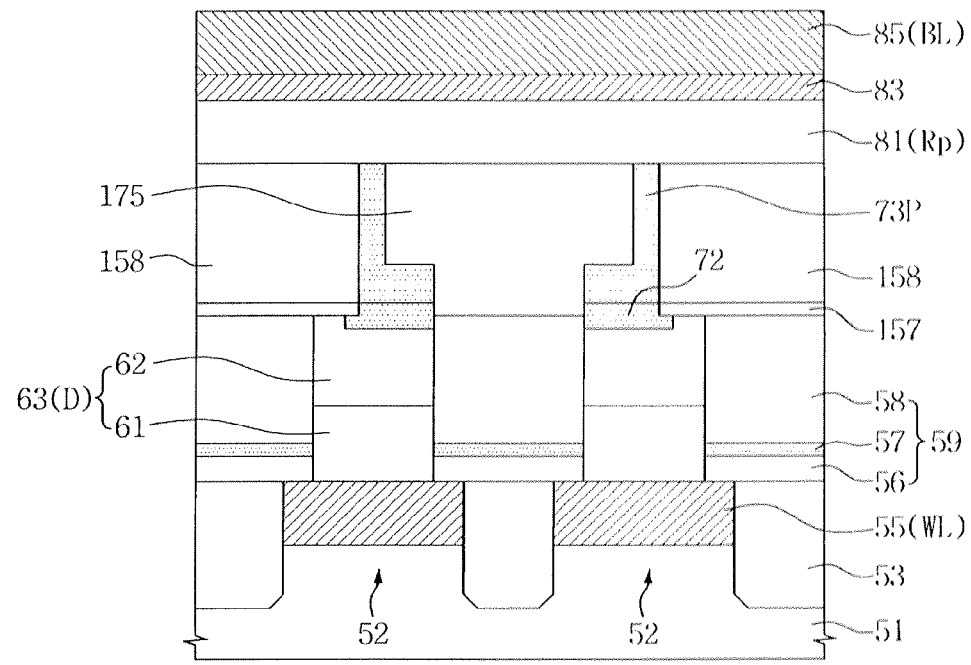
Figure 41:
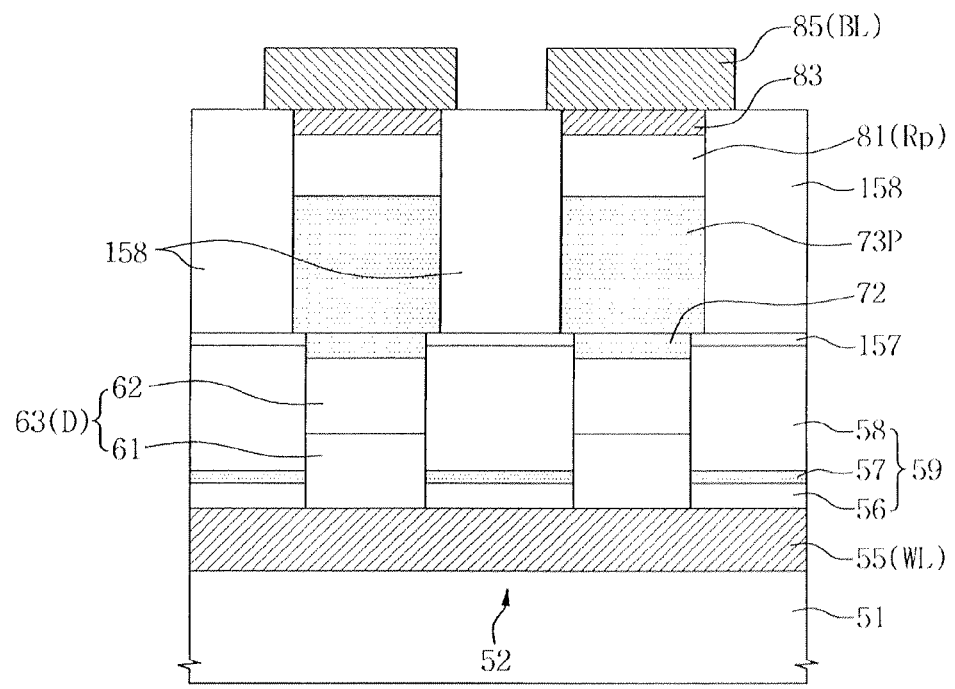

FIGS. 35-40, 42, and 43 are cross-sections along line II-II' of FIG. 34. FIG. 41 is a cross-section along line III-III' of FIG. 34. Referring to FIGS. 35 and 36, an active region 52 including a word line 55 (WL) and an isolation layer 53 may be formed in a substrate 51. An insulating structure 59 may be formed on the substrate 51. The insulation structure 59 may include a buffer layer 56 adjacent to the substrate 51, an etch stop 57 adjacent to the buffer layer 56, and an interlayer insulating layer 58 adjacent to the etch stop 57. A contact hole 59H, similar to that of FIG. 4, for example, may be formed in the insulating structure 59 to expose the word line 55 (WL) of the substrate 51.

As described previously, a diode 63 may be formed in the contact hole 59H. The diode 63 may include a first semiconductor pattern 61 adjacent to the word line 55 of the substrate 51 and a second semiconductor pattern 62 above the first semiconductor pattern 61.

As illustrated in FIG. 36, a second buffer layer 157 and a second insulating layer 158 may be formed on the insulating structure 59 and the diode 63. A hole 158G may be formed in the second buffer layer 157 and second insulating layer 158.

The hole 158G may be formed to contact portions of adjacent second semiconductor patterns 62. As discussed previously, a metal layer 65 and alloy element layer 66 may be formed on the sides of the contact hole 158G.

Figure 37:
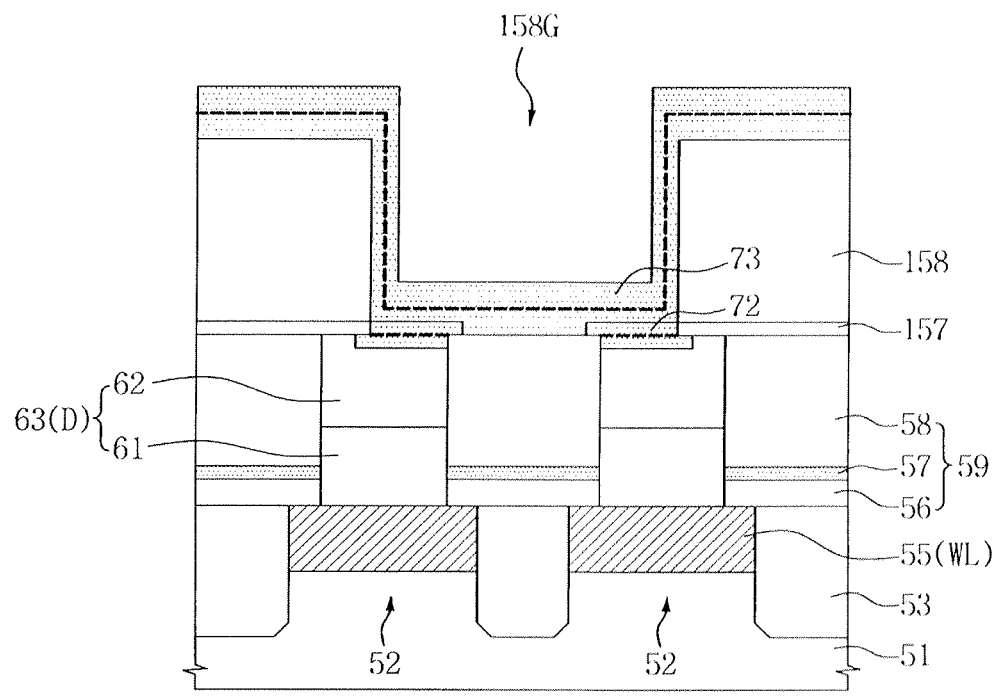

As illustrated in FIG. 37, the substrate 51 may be annealed, including the diode 63 (D), metal layer 65, and alloy element layer 66 to form a metal silicide layer 72 and a metal alloy layer 73. The metal silicide layer 72 may include a portion of the second semiconductor pattern 62 adjacent to the metal layer 65. The metal alloy layer 73 may include a portion of the metal layer 65 adjacent to the alloy element layer 66.

Figure 38:
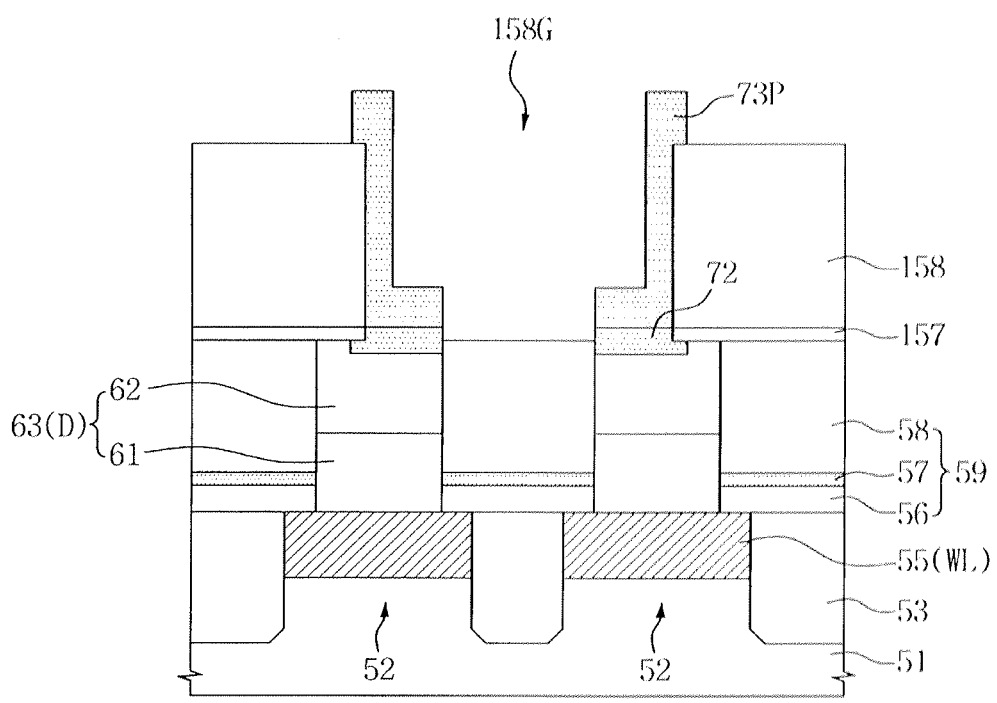

As illustrated in FIG. 38, portions of the metal silicide layer 72 and metal alloy layer 73 may be etched or otherwise removed to form a lower electrode 73P. The lower electrode 73P may correspond to the portion of the metal silicide layer 72 and the metal alloy layer 73 alloyed to and located above only a portion of the second semiconductor pattern 62.

As illustrated in FIG. 39, a top-most portion of the second insulating layer 158 and lower electrode 73P may be removed. A core layer 175 may be formed in the space within the hole 158G of FIG. 36. As illustrated in FIG. 40, a phase change material pattern 81 (Rp), upper electrode 83, and bit line 85 (BL) may be formed on the upper surfaces of the insulating layer 158, first electrode 73P, and core layer 175.

FIG. 41 illustrates a cross-section of the phase change memory device of FIGS. 34 and 40 as seen from the line III-III' of FIG. 34. FIG. 41 illustrates two adjacent bit lines 85 (BL) connected to a single word line 55 (WL) via the upper electrode 83, phase change material pattern 81 (Rp), lower electrode 73P, the metal silicide layer 72, and diode 63 (D).

Figure 42:
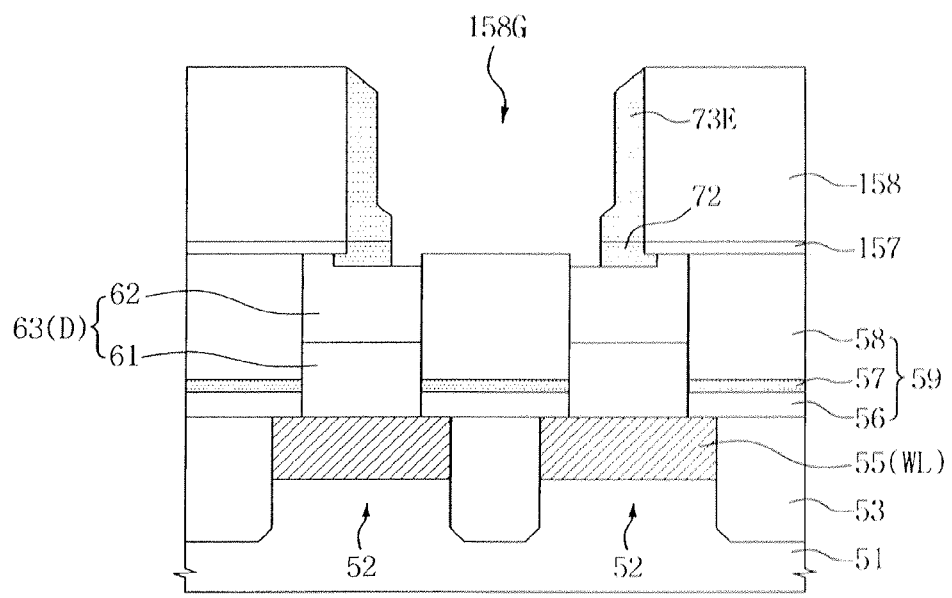
Figure 43:
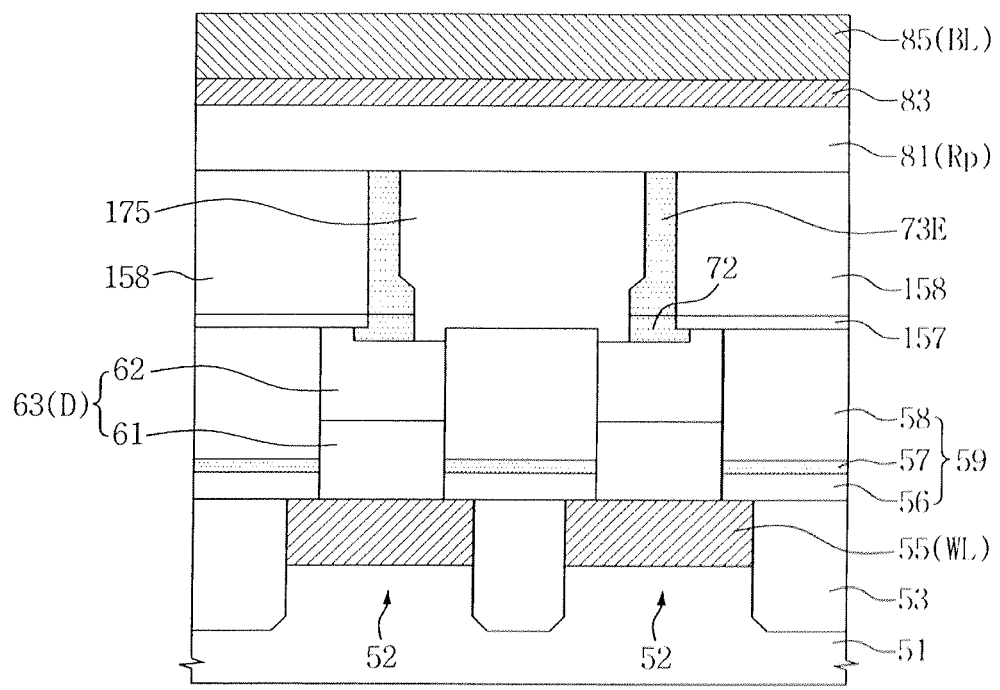

FIG. 42 illustrates a phase change memory device according to another embodiment of the present general inventive concept. As illustrated in FIG. 42, the lower electrode 73E may be formed to be located above a center portion of the diode 63. Portions of the lower electrode 73E and metal silicide layer 72 may be removed so that a portion of the second semiconductor pattern 62 is exposed. Then, as described above, and as illustrated in FIG. 43, the core layer 175 may be formed in the hole 158G. The phase change material pattern 81 (Rp), upper electrode 83, and bit line 85 (BL) may be formed on the insulation layer 158, lower electrode 73E, and the core layer 175.

Figure 44:
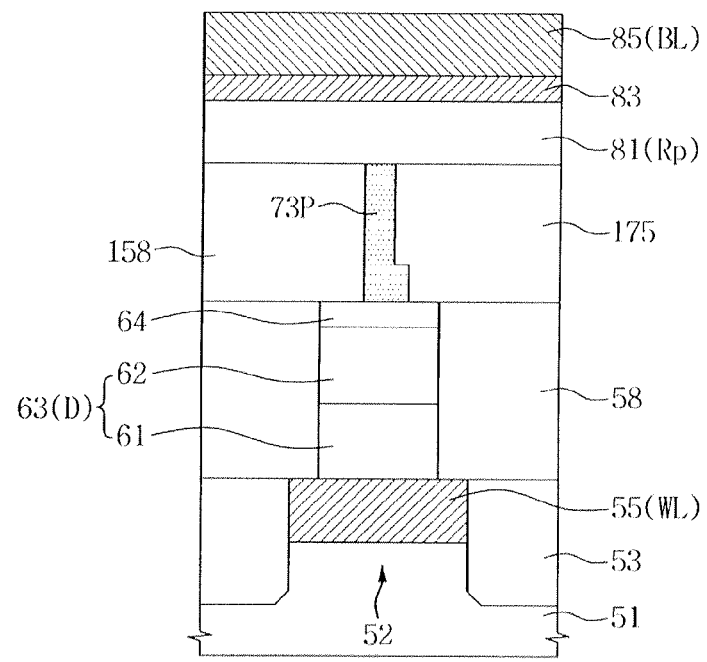
Figure 45:
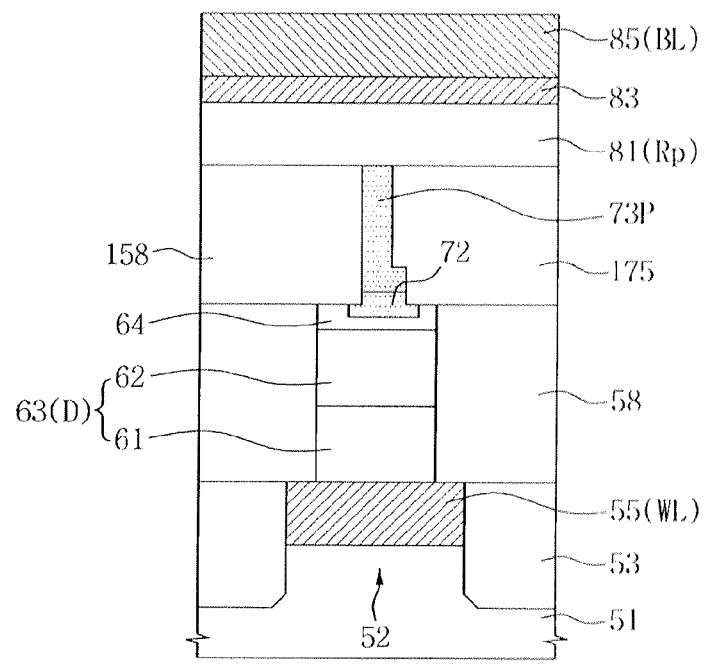

FIGS. 44 and 45 illustrate cross-sectional views of a single word line 55 (WL), diode 63 (D), and lower electrode 73P. A diode electrode 64 is positioned between the second semiconductor pattern 62 and the lower electrode 73P. As illustrated in FIG. 45, the metal silicide layer 72 may be formed to connect the diode electrode 64 to the lower electrode 73P.

According to the example embodiments, a diode may be formed on a substrate, a metal layer and an alloying element layer may be formed on the diode, and the substrate may be annealed, thereby forming a metal silicide layer and a metal alloy layer. The metal silicide layer may be in direct contact with the diode and the metal alloy layer. Thicknesses of the metal layer and the alloying element layer may be controlled to adjust a composition ratio of the metal alloy layer. That is, the thicknesses of the metal layer and the alloying element layer may be controlled to adjust the resistance of the metal alloy layer. The metal alloy layer may serve as a heating device. A lower electrode may be formed using the metal alloy layer. In addition, the metal silicide layer may serve as an ohmic layer. Thus, a semiconductor device, which provides a simple process, maximizes production efficiency, and has an excellent electrical characteristic, can be formed.

Although various embodiments of the present general inventive concept have been illustrated and described, it will be appreciated by those skilled in the art that changes may be made in these embodiments without departing from the principles and spirit of the present general inventive concept, the scope of which is defined in the appended claims and their equivalents.

What is claimed is:

1. A method of forming a memory device, the method comprising:
   forming a metal silicide layer and a metal alloy layer as an electrode; and
   forming a data storage element connected to the electrode,
   wherein the metal silicide layer has one of a concave surface or a convex surface to correspond to a respective convex surface or concave surface of the metal alloy layer such that the concave or convex surface of the metal silicide layer and the respective convex or concave surface of the metal alloy layer form a curved boundary.

2. The method of claim 1, wherein the forming of the metal silicide layer and the metal alloy layer comprises:
   forming a recessed portion on the metal silicide layer; and
   forming the metal alloy layer in the recessed portion of the metal silicide layer such that the recessed portion corresponds to the curved boundary.

3. The method of claim 1, wherein the forming of the electrode comprises:
   forming a semiconductor layer,
   forming a metal layer on the semiconductor layer;
   forming an alloying element layer on the metal layer,
   treating the semiconductor layer and the metal layer to form the metal silicide layer with a recessed portion; and
   treating the metal layer and the alloying element layer to form the metal alloy layer having a protruding portion disposed in the recessed portion.

4. The method of claim 1, wherein the forming of the electrode comprises:
   forming a semiconductor layer containing a first material;
   forming a metal layer having a second material on the semiconductor layer; and
   forming an alloying element layer having a third material on the metal layer.

5. The method of claim 4, wherein the forming of the metal silicide layer comprises treating the first material of the semiconductor layer and the second material of the metal layer to form the metal silicide layer.

6. The method of claim 4, wherein the forming of the metal alloy layer comprises treating the second material of the metal layer and the third material of the alloying element layer to form the metal alloy layer.

7. The method of claim 4, wherein the forming of the metal silicide layer and the metal alloy layer comprises:
   simultaneously treating the first material, second material, and the third material such that the treated first and second materials have the curved boundary line with the treated second and third materials.

8. The method of claim 4, wherein the forming of the metal silicide layer and the metal alloy layer comprises:
   simultaneously treating the first material and the second material to form the metal silicide layer with a recessed portion with respect to the semiconductor layer, and the second material and the third material to form the metal alloy layer third material having a shape corresponding to the recessed portion as the boundary line.

9. The method of claim 4, wherein:
   the first material comprises a semiconductor material with ion implantation;
   the second material comprises a transition metal; and
   the third material comprises one of a material that includes carbon and a nitride material.

10. The method of claim 4, wherein:
    the semiconductor layer comprises a word line formed on a plane in a substrate;
    the semiconductor layer comprises a diode layer on another plane; and
    a boundary formed between the metal silicide layer and the metal alloy layer is the curved line with respect to the plane and the another plane.

11. The method of claim 1, wherein the metal layer comprises a first metal layer disposed on an area to form the metal silicide layer with the semiconductor layer, and a second metal layer disposed on another area different from the area to form the metal alloy layer with the alloying element layer.

12. The method of claim 1, wherein the forming of the electrode comprises:
    simultaneously forming the metal silicide layer and the metal alloy layer.

13. The method of claim 1, wherein the metal silicide layer comprises an ohmic layer, and the metal alloy layer comprises a heating component to heat the data storage element to store data.

14. The method of claim 1, further comprising:
    forming a contact hole in a portion of the metal alloy layer,
    wherein the data storage element is disposed on the contact hole and the metal alloy layer.

15. The method of claim 1, further comprising:
    forming an insulating layer formed on a portion of the metal alloy layer,
    wherein the data storage element is disposed on the insulating layer and the metal alloy layer.

16. The method of claim 1, wherein:
    the metal alloy layer comprises a nitride alloy layer.

17. The method of claim 1, further comprising:
    forming a nitride alloy layer formed between the data storage element and a portion of the metal alloy layer.

18. The method of claim 1, further comprising:
    forming another metal alloy layer between the metal alloy layer and the data storage element.

19. The method of claim 1, further comprising:
    forming an insulation layer to define a contact hole in which the electrode is formed; and
    forming a word line and a bit line to electrically contact the electrode and the data storage element,
    wherein at least a portion of one of the word line and the bit line is formed to be disposed within the contact hole defined by the insulation layer.

20. The method of claim 1, further comprising:
    forming an insulation layer to define a contact hole in which the electrode is formed;
    forming a spacer in the contact hole defined by the insulation layer; and
    forming a word line and a bit line to electrically contact the electrode and the data storage element,
    wherein the spacer comprises inside walls to define a width, and the metal silicide layer and the metal alloy layer metal are formed within the width of the inside walls.

21. The method of claim 1, further comprising:
    forming a spacer on a portion of the semiconductor layer to form a contact hole,
    wherein the spacer comprises inside walls to define a width narrower than a width of the semiconductor layer, and the metal silicide layer and a metal alloy layer metal are formed within the inside walls.

22. The method of claim 21, wherein the forming of the data storage element comprises forming the data storage element to be disposed within the width defined by the inside walls of the spacer.

23. The method of claim 21, further comprising:
forming a word line and a bit line to electrically contact the electrode and the data storage element,
wherein at least a portion of one of the word line and the bit line is formed to be disposed within the width defined by the inside walls of the spacer.

24. The method of claim 1, wherein the metal silicide layer is disposed on the semiconductor layer in a curved direction, and the metal alloy layer comprises a first portion disposed on the metal silicide layer in the curved direction and a second portion extended from an end of the metal silicide layer in another direction toward the data storage element.

25. The method of claim 1, wherein at least a portion of the metal silicide layer is disposed inside the semiconductor layer.

26. The method of claim 1, wherein the metal silicide layer comprises a first portion formed in the semiconductor layer and a second portion protruding from the first portion outside the semiconductor layer.

27. The method of claim 1, wherein the forming of the metal silicide layer and the metal alloy layer comprises:
forming a substrate; and
repeatedly forming a combination of a transition metal and an element including carbon on the substrate to form the metal silicide layer and the metal alloy layer as the electrode.

28. The method of claim 1, wherein:
the concave surface of the metal silicide layer comprises a center area and a circumference area having a thickness to be increased according to a distance from the center area.

29. The method of claim 1, wherein:
the convex surface of the metal alloy layer comprises a center area and a circumference area having a distance with respect to the data storage element to be decreased according to a distance from the center area.

* * * * *